(12) United States Patent
Otsuki

(10) Patent No.: US 12,716,840 B2
(45) Date of Patent: Aug. 25, 2026

(54) MEASUREMENT METHOD AND SUBSTRATE PROCESSING APPARATUS

(71) Applicant: Tokyo Electron Limited, Tokyo (JP)

(72) Inventor: Yuji Otsuki, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 133 days.

(21) Appl. No.: 18/698,613

(22) PCT Filed: Sep. 26, 2022

(86) PCT No.: PCT/JP2022/035587

§ 371 (c)(1),
(2) Date: Apr. 4, 2024

(87) PCT Pub. No.: WO2023/058476

PCT Pub. Date: Apr. 13, 2023

(65) Prior Publication Data

US 2025/0003874 A1 Jan. 2, 2025

(30) Foreign Application Priority Data

Oct. 8, 2021 (JP) ................................ 2021-165852

(51) Int. Cl.

| | |
|---|---|
| ***G01N 21/552*** | (2014.01) |
| ***C23C 16/52*** | (2006.01) |
| ***G01N 21/3563*** | (2014.01) |
| ***G01N 21/84*** | (2006.01) |
| ***H10P 74/00*** | (2026.01) |

(52) U.S. Cl.
CPC ........... *G01N 21/552* (2013.01); *C23C 16/52* (2013.01); *G01N 21/3563* (2013.01); *G01N 21/8422* (2013.01); *H10P 74/23* (2026.01); *G01N 2021/3568* (2013.01); *G01N 2021/8427* (2013.01); *G01N 2201/0638* (2013.01)

(58) Field of Classification Search
CPC ............ G01N 21/552; G01N 21/3563; G01N 21/8422; G01N 2021/3568; G01N 2021/8427; G01N 2201/0638; C23C 16/52; H01L 22/20
See application file for complete search history.

(56) References Cited

FOREIGN PATENT DOCUMENTS

| | | |
|---|---|---|
| JP | H05-102040 A | 4/1993 |
| JP | H07-297247 A | 11/1995 |
| JP | H08-062125 A | 3/1996 |

(Continued)

*Primary Examiner* — Uzma Alam
*Assistant Examiner* — Fani Polyzos Boosalis
(74) *Attorney, Agent, or Firm* — Nath, Goldberg & Meyer; Jerald L. Meyer; Tanya E. Harkins

(57) ABSTRACT

A measurement method includes: a first measurement step of irradiating a prism with infrared light and measuring reflected light totally reflected by the prism; a second measurement step of irradiating the prism with infrared light while the prism is arranged on a substrate and measuring reflected light totally reflected by a surface of the prism on the substrate; and a calculation step of calculating an absorbance spectrum from an intensity spectrum of infrared light for each wave number of the reflected light measured in the first measurement step and an intensity spectrum of infrared light for each wave number of the reflected light measured in the second measurement step.

16 Claims, 26 Drawing Sheets

(56) References Cited

FOREIGN PATENT DOCUMENTS

| | | | | | |
|---|---|---|---|---|---|
| JP | H08-233562 | A | | 9/1996 | |
| JP | H11-352072 | A | | 12/1999 | |
| JP | 2001192826 | A | * | 7/2001 | ........... G11B 11/105 |
| JP | 2006-245509 | A | | 9/2006 | |
| WO | WO-2019093128 | A1 | * | 5/2019 | ............ G01N 21/21 |

* cited by examiner

FIG. 1

First measurement step
Second measurement step
51
90a
90
92
W
91
51
90a
90
92
W
91

| Sample | 1:1 L/S | 1:10 L/S | 1:100 L/S |
|---|---|---|---|
| Refractive index | 2.2 | 3.2 | 3.4 |
| Penetration depth | 0.55μm | 0.92μm | 1.21μm |

FIG. 34

Before substrate processing (before etching)

50
51
90a
110
90
W

After substrate processing (after etching)

50
51
90a
110
W

MEASUREMENT METHOD AND SUBSTRATE PROCESSING APPARATUS

This is a National Phase Application filed under 35 U.S.C. 371 as a national stage of PCT/JP2022/035587, filed Sep. 26, 2022, an application claiming the benefit from the Japanese patent Application No. 2021-165852, filed Oct. 8, 2021, the content of each of which is hereby incorporated by reference in its entirety.

TECHNICAL FIELD

The present disclosure relates to a measurement method and a substrate processing apparatus.

BACKGROUND

Patent Document 1 discloses a technique that brings a prism into contact with a surface of a substrate and evaluates a surface layer or the surface of the substrate by the light totally reflected by a surface of the prism in contact with the substrate and penetrating from the prism toward the substrate side.

PRIOR ART DOCUMENT

Patent Document

Patent Document 1: Japanese laid-open publication No. 7-297247

The present disclosure provides some embodiments of a technique capable of detecting a state of a sample.

SUMMARY

The measurement method according to the embodiment includes a first measurement step, a second measurement step, and a calculation step. In the first measurement step, a prism is irradiated with infrared light, and the reflected light totally reflected by the prism is measured. In the second measurement step, infrared light is irradiated onto the prism while the prism is arranged on a substrate, and the reflected light totally reflected by a surface of the prism on the substrate is measured. In the calculation step, an absorbance spectrum is calculated from an intensity spectrum indicating the absorbance of infrared light for each wave number of reflected light measured in the first measurement step and an intensity spectrum indicating the absorbance of infrared light for each wave number of reflected light measured in the second measurement step.

According to the present disclosure, it is possible to detect a state of a sample.

BRIEF DESCRIPTION OF DRAWINGS

FIG. 1 is a schematic cross-sectional view showing an example of a film forming apparatus according to an embodiment.

FIG. 34 is a diagram illustrating an example of a substrate processing step according to an embodiment.

DETAILED DESCRIPTION

Figure 2:
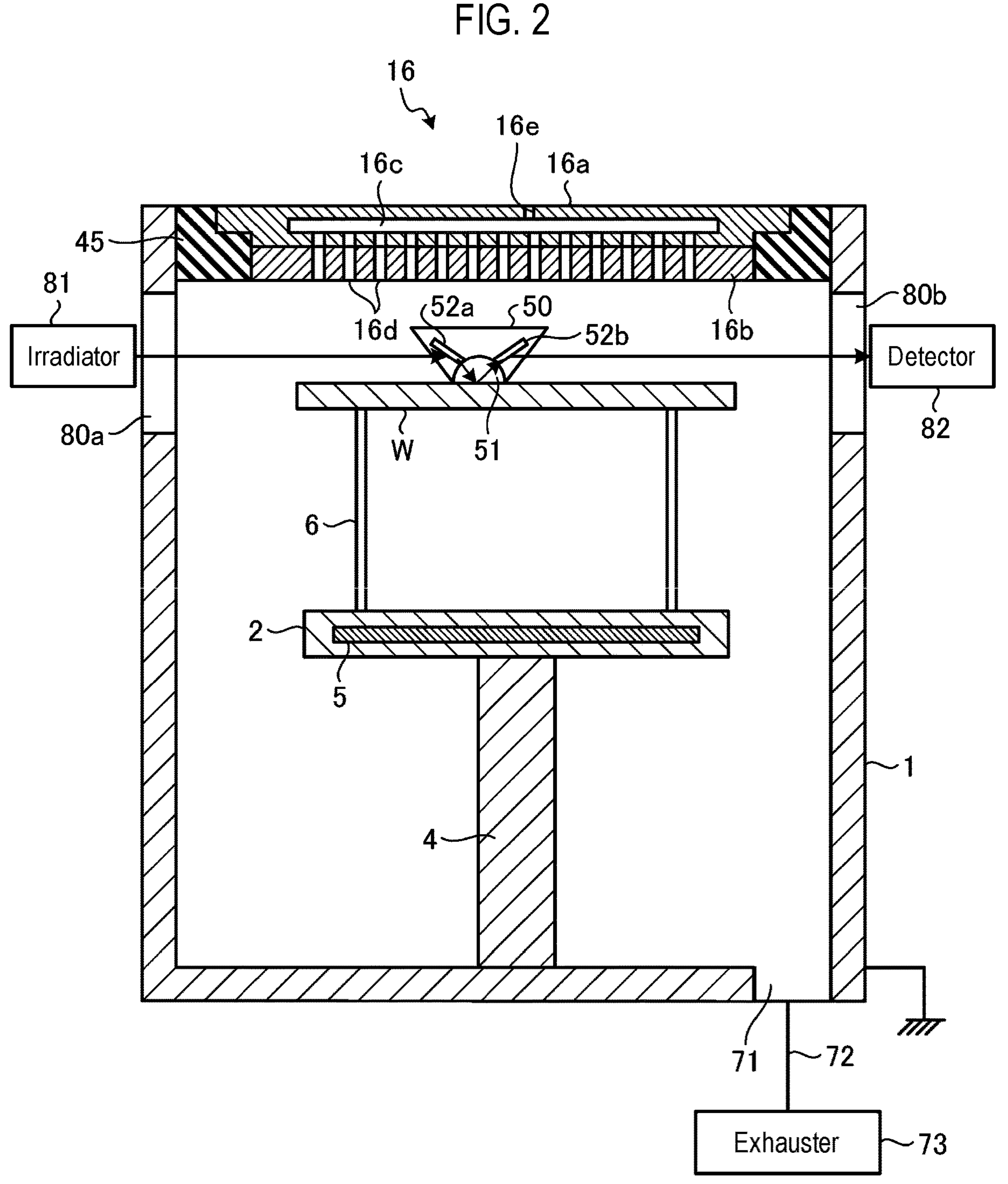
FIG. 2 is a diagram showing a state in which a substrate is raised from a stage in the film forming apparatus according to the embodiment.

Hereinafter, embodiments of a measurement method and a substrate processing apparatus disclosed herein will be described in detail with reference to the drawings. Note that the disclosed measurement method and substrate processing apparatus are not limited by these embodiments.

An ATR (Attenuated Total Reflection) method is known as a method for analyzing a surface layer of a substrate. In the ATR method, a prism is brought into contact with a surface of a substrate, and a state of the sample is detected by measuring light which is totally reflected by a surface of the prism in contact with the substrate.

However, if the measured light contains noise due to the prism or the like, the state of the sample cannot be detected with high accuracy.

Therefore, there are high expectations for a technique capable of detecting the state of a sample.

Embodiment

[Configuration of Film Forming Apparatus]

Figure 1:
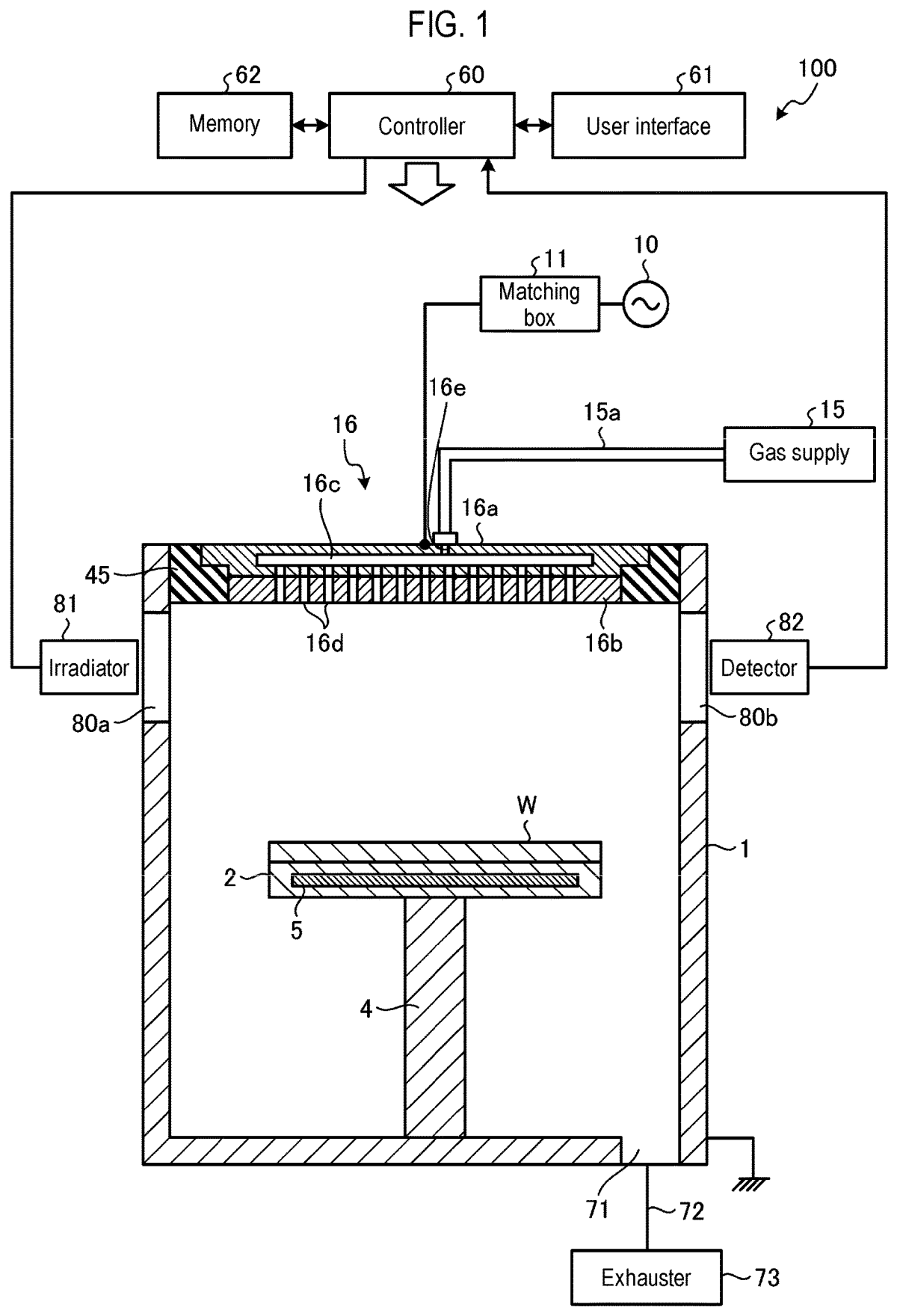

Next, embodiments will be described. First, an example of a substrate processing apparatus according to the present disclosure will be described. In the following, there will be mainly described a case where the substrate processing apparatus of the present disclosure is used as a film forming apparatus 100 and a film formation is performed as a substrate processing by the film forming apparatus 100. FIG. 1 is a schematic cross-sectional view showing an example of the schematic configuration of the film forming apparatus 100 according to an embodiment. In the present embodiment, the film forming apparatus 100 corresponds to the substrate processing apparatus of the present disclosure. In one embodiment, the film forming apparatus 100 is an apparatus that forms a film on a substrate W. The film forming apparatus 100 shown in FIG. 1 includes a chamber 1 configured to be airtight and electrically connected to a ground potential. The chamber 1 has a cylindrical shape and is made of, for example, aluminum, nickel, or the like with an anodic oxide film formed on its surface. A stage 2 is provided within the chamber 1.

The stage 2 is made of metal such as aluminum or nickel. A substrate W such as a semiconductor wafer is mounted on an upper surface of the stage 2. The stage 2 horizontally supports the mounted substrate W. A lower surface of the stage 2 is electrically connected to a support member 4 made of a conductive material. The stage 2 is supported by the support member 4. The support member 4 is supported on a bottom surface of the chamber 1. A lower end of the support member 4 is electrically connected to the bottom surface of the chamber 1 and grounded via the chamber 1. The lower end of the support member 4 may be electrically connected to the bottom surface of the chamber 1 via a circuit which is adjusted to lower the impedance between the stage 2 and the ground potential.

A heater 5 is embedded in the stage 2, and can heat the substrate W mounted on the stage 2 to a predetermined temperature. The stage 2 may include a flow path (not shown) formed in the stage 2 for circulating a coolant. A coolant whose temperature is controlled by a chiller unit provided outside the chamber 1 may be circulated and supplied into the flow path. The stage 2 may control the substrate W to a predetermined temperature by the heating with the heater 5 and the cooling with the coolant supplied from the chiller unit. The stage 2 may not be equipped with the heater 5, and may control the temperature of the substrate W only by the coolant supplied from the chiller unit.

The stage 2 may have an electrode embedded in the stage 2. Due to the electrostatic force generated by the DC voltage supplied to the electrode, the stage 2 can attract the substrate W mounted on its upper surface.

The stage 2 is provided with lift pins 6 for raising and lowering the substrate W. In the film forming apparatus 100, when the substrate W is transferred or when the substrate W is measured by infrared spectroscopy, the lift pins 6 are caused to protrude from the stage 2, so that the substrate W can be supported from the rear surface and raised from the stage 2 by the lift pins 6. FIG. 2 is a diagram showing a state in which the substrate W is raised from the stage 2 in the film forming apparatus 100 according to the embodiment. The substrate W is transferred to the film forming apparatus 100. For example, the side wall of the chamber 1 is provided with a loading/unloading port (not shown) for loading and unloading the substrate W. A gate valve for opening and closing the loading/unloading port is provided at the loading/unloading port. When loading and unloading the substrate W, the gate valve is kept open. The substrate W is loaded into the chamber 1 from the loading/unloading port by a transfer mechanism (not shown) within a transfer chamber. The film forming apparatus 100 controls an elevating mechanism (not shown) provided outside the chamber 1 to raise the lift pins 6 and receive the substrate W from the transfer mechanism. After the transfer mechanism is removed, the film forming apparatus 100 controls the elevating mechanism to lower the lift pins 6 and mount the substrate W on the stage 2.

Above the stage 2 and on an inner surface of the chamber 1, a shower head 16 having a substantially disk-like shape is installed. The shower head 16 is supported above the stage 2 via an insulating member 45 made of ceramics or the like. Thus, the chamber 1 and the shower head 16 are electrically insulated. The shower head 16 is made of conductive metal such as nickel or the like.

The shower head 16 includes a top plate member 16*a* and a shower plate 16*b*. The top plate member 16*a* is provided so as to close the inside of the chamber 1 from above. The shower plate 16*b* is provided below the top plate member 16*a* so as to face the stage 2. A gas diffusion space 16*c* is formed in the top plate member 16*a*. A large number of gas discharge holes 16*d* opened toward the gas diffusion space 16*c* are distributed and formed over the top plate member 16*a* and the shower plate 16*b*.

A gas introduction port 16*e* for introducing various gases into the gas diffusion space 16*c* is formed in the top plate member 16*a*. A gas supply path 15*a* is connected to the gas introduction port 16*e*. A gas supply 15 is connected to the gas supply path 15*a*.

The gas supply 15 has gas supply lines connected to gas supply sources of various gases used for film formation. Each gas supply line is branched appropriately according to a film formation process, and is provided with control devices for controlling the flow rate of a gas, for example, a valve such as on-off valves and a flow rate controller such as a mass flow controller. The gas supply 15 is capable of controlling the flow rates of various gases by controlling the control devices such as the on-off valve and the flow rate controller provided in each gas supply line.

The gas supply 15 supplies various gases used for film formation to the gas supply path 15*a*. For example, the gas supply 15 supplies a raw material gas for film formation to the gas supply path 15*a*. Further, the gas supply 15 supplies a reaction gas reacting with a purge gas and a raw material gas to the gas supply path 15*a*. The gas supplied to the gas supply path 15*a* is diffused in the gas diffusion space 16*c* and discharged from the respective gas discharge holes 16*d*.

The space surrounded by the lower surface of the shower plate 16*b* and the upper surface of the stage 2 constitutes a processing space in which a film formation process is performed. Further, the shower plate 16*b* is paired with the stage 2 and is configured as an electrode plate for forming capacitively coupled plasma (CCP) in the processing space. A radio-frequency power source 10 is connected to the shower head 16 via a matching box 11. Plasma is formed in the processing space by applying radio-frequency power (RF power) from the radio-frequency power source 10 to the gas supplied to the processing space 40 via the shower head 16 and supplying the gas from the shower head 16. The radio-frequency power source 10 may be connected to the stage 2 instead of being connected to the shower head 16, and the shower head 16 may be grounded. In the present embodiment, the parts for performing film formation, such as the shower head 16, the gas supply 15, and the radio-frequency power source 10, correspond to the substrate processor of the present disclosure. In the present embodiment, the substrate processor performs a film formation step as a substrate processing step on the substrate W.

An exhaust port 71 is formed at the bottom of the chamber 1. An exhauster 73 is connected to the exhaust port 71 via an exhaust pipe 72. The exhauster 73 includes a vacuum pump and a pressure regulation valve. The exhauster 73 can reduce and adjust the pressure inside the chamber 1 to a predetermined degree of vacuum by operating the vacuum pump or the pressure regulation valve.

The film forming apparatus 100 according to the present embodiment can perform infrared spectroscopy (IR) measurement on the substrate W in the chamber 1 to detect the state of the sample such as the state of a film formed on the substrate W. In the film forming apparatus 100 according to the present embodiment, the state of the sample is detected by an ATR method, which is an infrared spectroscopy method.

The chamber 1 is provided with a window 80*a* and a window 80*b* on side walls facing each other across the stage 2. The windows 80*a* and 80*b* are sealed with a member such as quartz that is transparent to infrared light. An irradiator 81 that irradiates infrared light is provided outside the window 80*a*. A detector 82 capable of detecting infrared light is provided outside the window 80*b*.

When performing the measurement using the ATR method, the film forming apparatus 100 causes the lift pins 6 to protrude from the stage 2 to raise the substrate W from the stage 2, as shown in FIG. 2. A prism unit 50 is arranged on the surface of the substrate W. The prism unit 50 is transferred by a transfer mechanism (not shown) and arranged on the surface of the substrate W. The prism unit 50 may be stored within the film forming apparatus 100 or may be stored outside the film forming apparatus 100.

The prism unit 50 is configured to include a prism 51 and mirrors 52*a* and 52*b*.

The prism 51 is made of a highly refractive material that transmits infrared light. For example, the prism 51 is made of germanium (Ge). The prism 51 has a semicircular cross-section. By making the prism 51 semicircular, infrared light can be incident on the substrate W from various angles. The material and shape of the prism 51 are not limited thereto as long as the incident infrared light can be totally reflected at a surface of the prism 51 on the substrate W.

The mirror 52*a* is provided on the infrared light incident side with respect to the prism 51. The mirror 52*a* is rotatable and movable in order to adjust the angle of incidence of light incident on the prism 51. The angle and position of the mirror 52*a* are adjusted so that the light incident on the prism 51 can be totally reflected.

The mirror 52*b* is provided on the infrared light output side with respect to the prism 51. The mirror 52*b* is rotatable and movable in order to guide the light emitted from the prism 51 to the detector 82. The angle and position of the mirror 52*b* are adjusted so that the light totally reflected within the prism 51 can enter the detector 82.

Figure 3:
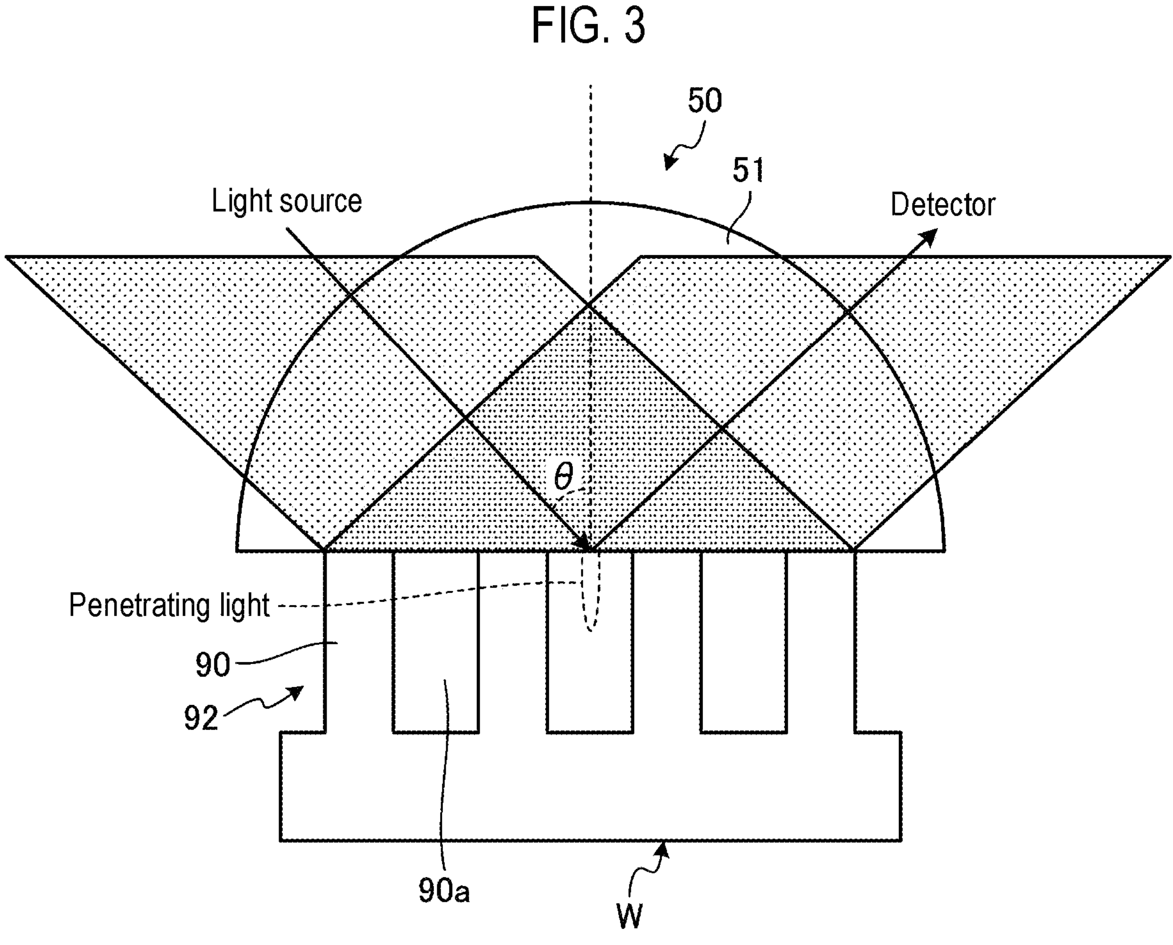
FIG. 3 is an enlarged view of a prism portion according to the embodiment.

FIG. 3 is an enlarged view of the portion of the prism 51 according to the embodiment. By arranging the prism unit 50 on the surface of the substrate W, the prism 51 comes into close contact with the surface of the substrate W. A pattern 90 including recesses 90*a* of a nanometer to micrometer scale, which is smaller than the wavelength (2.5 μm to 100 μm) of infrared light incident for measurement, is formed on the substrate W. For example, in the substrate W, a trench 92 is formed as a pattern 90 including a plurality of recesses 90*a*. The width of the trench 92 is preferably smaller than the wavelength of the infrared light. In view of the homogeneity of the measurement results, it is preferable that the width of the trench 92 is smaller. For example, the width of the trench 92 needs to be 100 μm or less, preferably 1 μm or less, which is smaller than 2.5 μm, and more preferably 0.1 μm (100 nm) or less. The infrared light incident on the prism 51 is totally reflected at the surface of the prism 51 that comes into contact with the substrate W. When the infrared light is totally reflected, the light penetrates into the substrate W. This penetrating light is called an evanescent wave. The depth at which the evanescent wave penetrates depends on the refractive index of the sample. For example, in the case of a silicon wafer, the depth at which the evanescent wave penetrates falls within a range of about 1 μm from the surface on which the light is totally reflected. The ATR method performs a measurement using absorption of light that occurs in a region where the evanescent wave penetrates.

Returning to FIG. 2, the positions of the window 80*a* and the irradiator 81 are adjusted so that the infrared light irradiated from the irradiator 81 is incident on the prism unit 50 disposed on the upper surface of the raised substrate W through the window 80*a*. The infrared light that has entered the prism unit 50 is reflected by the mirror 52*a*, incident on the prism 51, and totally reflected at the substrate of the prism 51 on the substrate W. The totally reflected infrared light is reflected in the horizontal direction by the mirror 52*b*. The positions of the window 80*b* and the detector 82 are adjusted so that the infrared light reflected in the horizontal direction by the mirror 52*b* of the prism unit 50 can enter the detector 82 through the window 80*b*.

The film forming apparatus 100 according to the present embodiment detects the state of a sample, such as the state of a film formed on a substrate W, by infrared spectroscopy. For example, the film forming apparatus 100 detects a film formed on the substrate W or a substance contained in the substrate W by the measurement using an ATR method.

The irradiator 81 includes a light source that emits infrared light and optical elements such as mirrors and lenses, and is capable of emitting interference infrared light. For example, the irradiator 81 splits the intermediate portion of an optical path through which the infrared light generated by the light source travels until it is emitted to the outside, into two optical paths using a half mirror or the like, and varies a length of one optical path with respect to a length of the other optical path to change an optical path difference and cause interference, thereby irradiating infrared light of various interference waves having different optical path differences. The irradiator 81 may include a plurality of light sources, and may control the infrared light of each light source with an optical element to emit infrared light of various interference waves having different optical path differences.

The detector 82 detects the signal intensity of the incident infrared light. In the present embodiment, the parts that perform measurement using the ATR method, such as the irradiator 81 and the detector 82, correspond to a measurer of the present disclosure.

The operation of the film forming apparatus 100 configured as described above is generally controlled by a controller 60. A user interface 61 and a memory 62 are connected to the controller 60.

The user interface 61 includes an operation section such as a keyboard through which a process manager inputs commands to manage the film forming apparatus 100, and a display section such as a display that visualizes and displays the operating status of the film forming apparatus 100. The user interface 61 accepts various operations. For example, the user interface 61 accepts a predetermined operation to instruct the start of plasma processing.

The memory 62 stores programs (software) for realizing various processes executed by the film forming apparatus 100 under the control of the controller 60, and data such as processing conditions and process parameters. The programs and data may be stored in a non-transitory computer-readable computer recording medium (e.g., a hard disk, a CD, a flexible disk, a semiconductor memory, etc.). Alternatively, the programs and data may be transmitted from other devices at any time, for example, via a dedicated line, and may be used online.

The controller 60 is, for example, a computer including a processor, a memory, and the like. The controller 60 reads programs and data from the memory 62 based on instructions from the user interface 61, and controls each part of the film forming apparatus 100, thereby executing a substrate processing method described later.

The controller 60 is connected to the irradiator 81 and the detector 82 via an interface (not shown) that inputs and outputs data, and is configured to input and output various kinds of information. The controller 60 controls the irradiator 81 and the detector 82. For example, the irradiator 81 irradiates various interference waves having different optical path differences based on the control information from the controller 60. Further, information on the signal intensity of the infrared light detected by the detector 82 is inputted to the controller 60.

Figure 4:
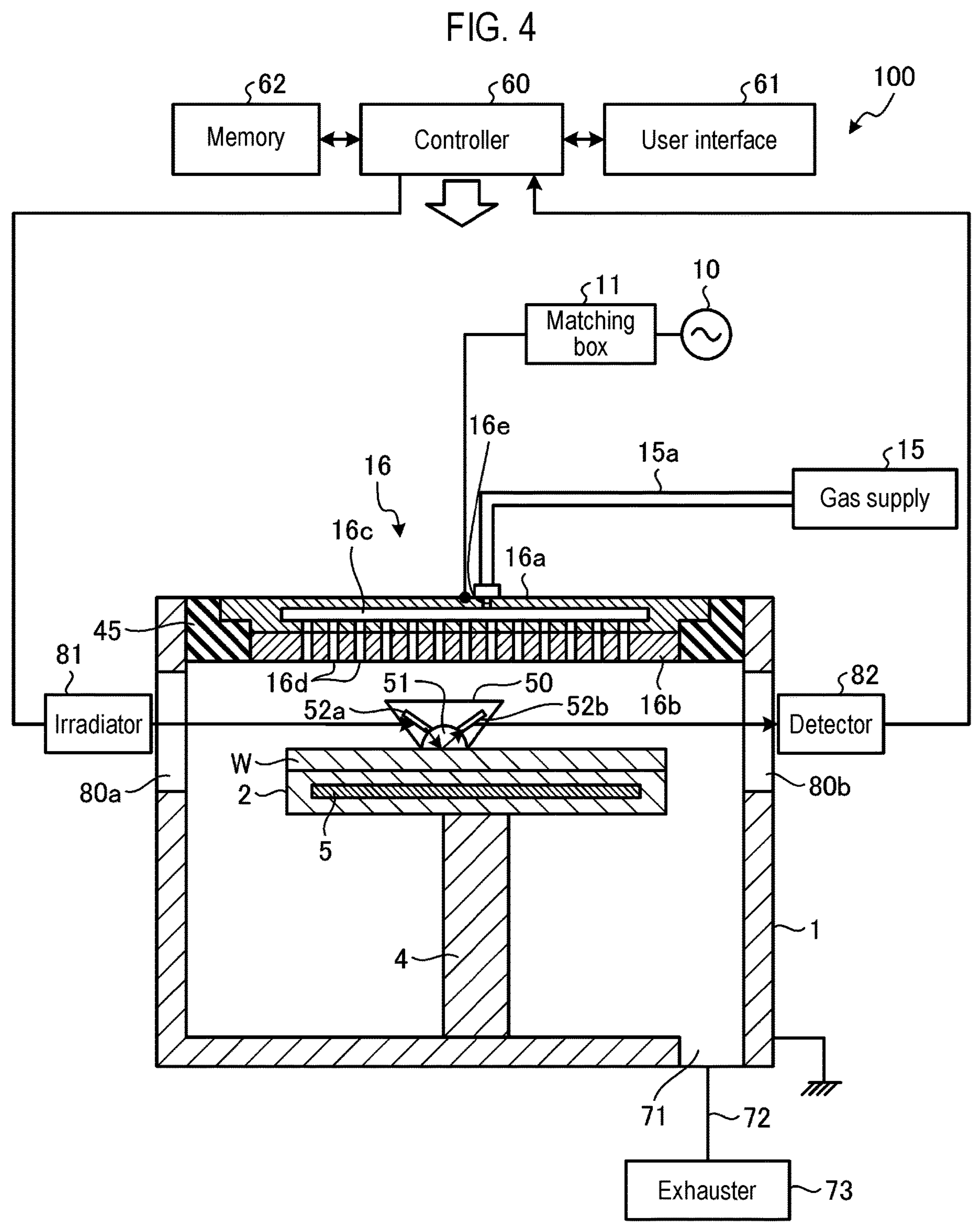
FIG. 4 is a schematic configuration diagram showing another example of the film forming apparatus according to the embodiment.

In FIGS. 1 and 2, there is shown a case where when performing measurement on the substrate W by the ATR method, the lift pins 6 are caused to protrude from the stage 2 and the substrate W is supported from the rear surface and raised from the stage 2 by the lift pins 6. However, the film forming apparatus 100 may be configured to perform measurement on the substrate W mounted on the stage 2 by the ATR method. FIG. 4 is a schematic configuration diagram showing another example of the film forming apparatus 100 according to the embodiment. FIG. 4 shows a case where the film forming apparatus 100 can perform measurement on the substrate W by the ATR method in a state in which the substrate W is mounted on the stage 2.

In the film forming apparatus 100 shown in FIG. 4, the stage 2 is supported by the support member 4 at the same height as the irradiator 81 and the detector 82. When detecting the state of a sample, the prism unit 50 is arranged on the surface of the substrate W in a state in which the substrate W is mounted on the stage 2. In this manner, the film forming apparatus 100 shown in FIG. 4 is capable of measuring the substrate W using the ATR method in a state in which the substrate W is mounted on the stage 2.

Figure 5:
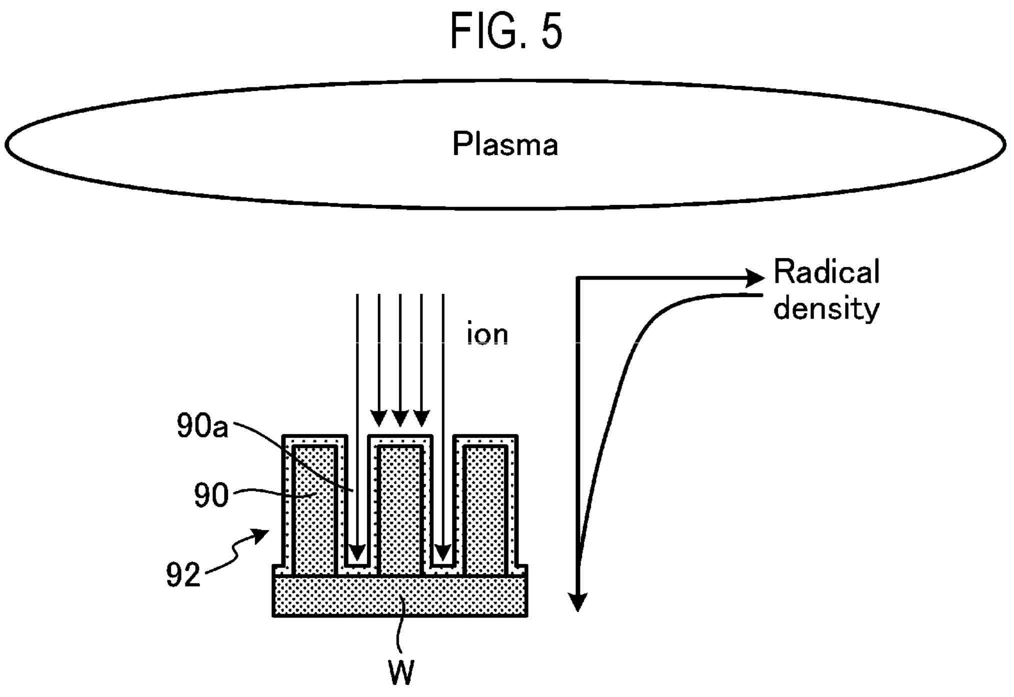
FIG. 5 is a diagram illustrating a film formation using plasma according to the embodiment.
Figure 6:
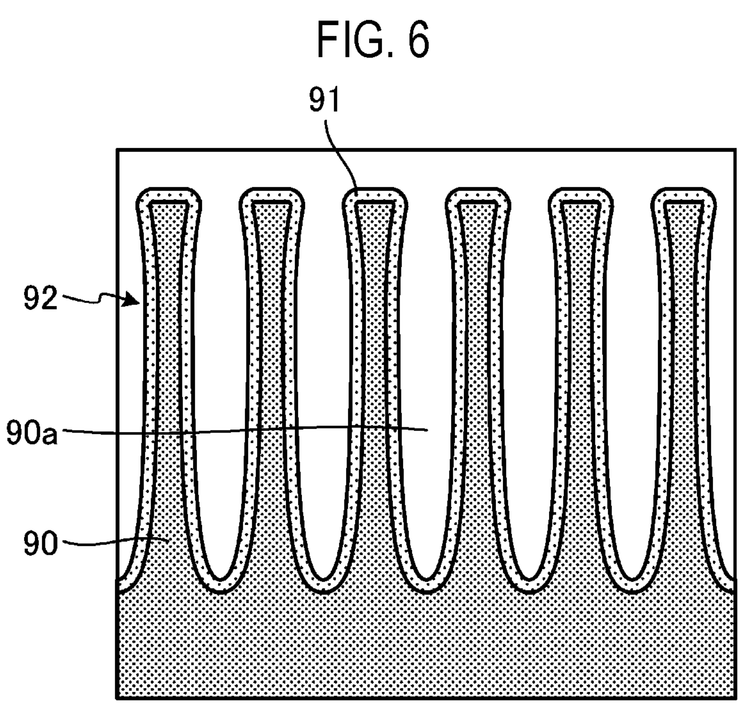
FIG. 6 is a diagram showing an example of a substrate on which a film is formed according to the embodiment.

Incidentally, semiconductor devices are becoming increasingly finer, and the patterns formed on the substrate W also have complex nanoscale shapes. In film formation using plasma, the film quality tends to deteriorate on the side walls and bottoms of recesses included in fine patterns. FIG. 5 is a diagram illustrating film formation using plasma according to the embodiment. In FIG. 5, the substrate W is shown. A pattern 90 including nanoscale recesses 90*a* is formed on the substrate W. For example, in the substrate W, a trench 92 is formed as a pattern 90 including a plurality of recesses 90*a*. In film formation using plasma, it is difficult for ions and radicals to reach the side walls and bottoms of the recesses 90*a*, and the film quality on the side walls and bottoms of the recesses 90*a* tends to deteriorate. In order to improve the film quality, it is necessary to analyze the composition of the film on the side walls and bottoms of the recesses 90*a*. FIG. 6 is a diagram showing an example of a substrate W on which a film according to the embodiment is formed. FIG. 6 schematically shows a state in which a film 91 is formed on a pattern 90 having recesses 90*a* by plasma ALD. For example, in FIG. 6, a film 91 is formed in a trench 92 formed in the substrate W.

As a technique for analyzing a formed film, for example, Fourier transform infrared spectroscopy (FT-IR) is known. In the FT-IR analysis, the state of the substrate W is detected by irradiating the substrate W with infrared light and detecting the light transmitted or reflected by the substrate W. However, the substrate W used in the manufacture of semiconductor devices may be, for example, a low-resistance silicon substrate, which may absorb infrared light, and FT-IR analysis may not be applicable thereto.

On the other hand, since the ATR method detects the light totally reflected at the interface between the prism 51 and the substrate W, the state of the substrate W can be detected even when a substrate W that absorbs infrared light is used. However, in the ATR method, the measured light may contain noise due to a prism or the like, and the state of a sample may not be detected with high accuracy.

Therefore, in the measurement method according to the present embodiment, the following process is performed to detect the state of a sample. For example, a first measurement step is performed on the prism 51 using an ATR method. Further, a second measurement step is performed on the film-formed substrate W by the ATR method. Then, an absorbance spectrum is calculated from the intensity spectrum of the infrared light for each wave number of the reflected light measured in the first measurement step and the intensity spectrum of the infrared light for each wave number of the reflected light measured in the second measurement step. For example, by subtracting the spectrum of the common logarithm of the intensity of the reflected light measured in the second measurement step from the spectrum of the common logarithm of the intensity of the reflected light measured in the first measurement step, the absorbance spectrum of infrared light for each wave number is calculated.

The first measurement step may include irradiating only the prism 51 with infrared light without arranging the prism 51 on the substrate W, and measuring the intensity of the reflected light totally reflected by the prism 51. Further, the first measurement step may include performing measurement by an ATR method for the prism 51 in a state in which the prism 51 is arranged on the substrate W before film formation.

For example, in the first measurement step, only the prism 51 is irradiated with infrared light, and the reflected light totally reflected by the prism 51 is measured. After the first measurement step, a film formation process is performed on the substrate W. In the second measurement step, infrared light is irradiated onto the prism 51 while the prism 51 is arranged on the film-formed substrate W, and the reflected light totally reflected at the interface between the substrate W and the prism 51 is measured. From the intensity spectrum of infrared light for each wave number of the reflected light measured in the first measurement process and the intensity spectrum of infrared light for each wave number of the reflected light measured in the second measurement process, an absorbance spectrum is calculated by the following formula (1).

$$A = \log 10 I_1 - \log 10 I_2 \quad (1)$$

In this formula, A is an absorbance, $\log_{10}$ is a common logarithm, $I_1$ is a reference light intensity, and $I_2$ is a light intensity of a sample.

Figure 7:
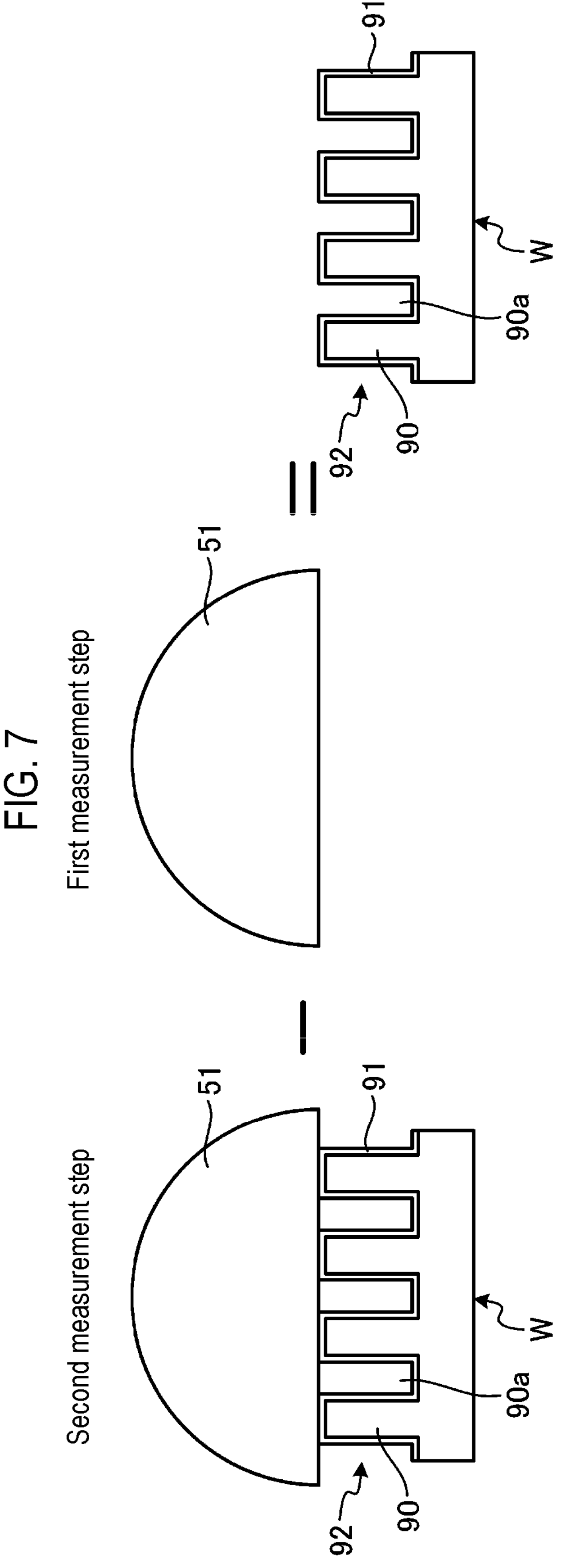
FIG. 7 is a diagram illustrating an example of an absorbance data according to the embodiment.

FIG. 7 is a diagram illustrating an example of absorbance data according to the embodiment. A trench 92 is formed in the substrate W as a pattern 90 including a plurality of recesses 90*a*. FIG. 7 schematically shows a case in which only the prism 51 is measured in the first measurement step, and the reflected light totally reflected by bringing the prism 51 into close contact with the film-formed substrate W is measured in the second measurement step. A film 91 is formed on the pattern 90 after film formation by plasma ALD. For example, in the substrate W, a film 91 is formed in the trench 92. The measurement results of the first measurement step include spectrum information of the prism 51 and the light source. The measurement results of the second measurement step include spectrum information of the prism 51, the substrate W after film formation, and the light source. The light intensity of the first measurement step is used as reference light intensity, the light intensity of the second measurement step is used as the light intensity of the sample, and the calculation of the above equation (1) is performed for each wave number to calculate the absorbance spectrum using only the prism 51 as a reference substance for the spectrum of the second measurement step. By doing so, it is possible to cancel the signals of the prism 51 and the light source, and it is possible to calculate the signal of the spectrum of the substrate W after film formation.

Figure 8:
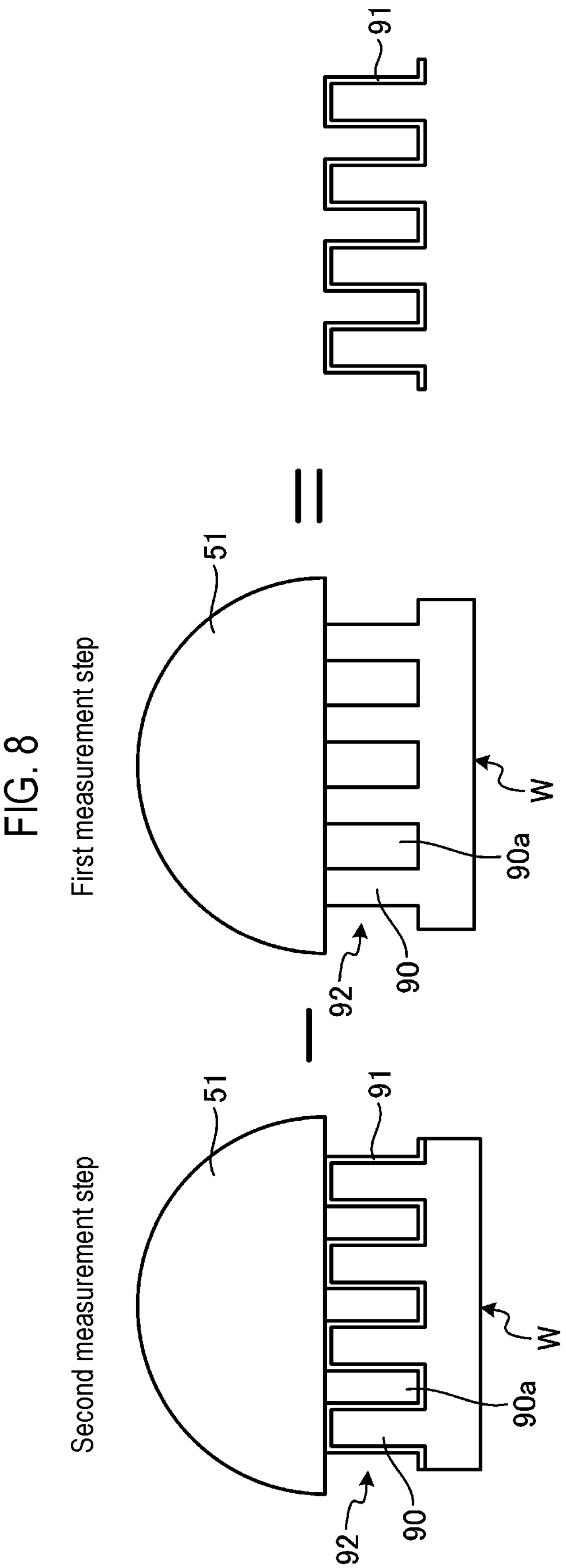
FIG. 8 is a diagram illustrating another example of the absorbance data according to the embodiment.

For example, in the first measurement step, the prism 51 is irradiated with infrared light in a state in which the prism 51 is arranged on the substrate W before film formation, and the reflected light totally reflected at the interface between the substrate W and the prism 51 is measured. After the first measurement step, a film formation process is performed on the substrate W. In the second measurement step, infrared light is irradiated onto the prism 51 while the prism 51 is arranged on the substrate W subjected to the film formation process, and the reflected light totally reflected at the interface between the substrate W and the prism 51 is measured. Then, the reflected light intensity of the infrared light for each wave number of the reflected light measured in the first measurement step is used as reference light intensity, and the absorbance spectrum of the reflected light measured in the second measurement step is calculated. FIG. 8 is a diagram illustrating another example of the absorbance data according to the embodiment. A trench 92 is formed in the substrate W as a pattern 90 including a plurality of recesses 90*a*. FIG. 8 schematically shows a case where in the first measurement step, the prism 51 is brought into close contact with the substrate W before film formation to measure the totally reflected light and in the second measurement step, the prism 51 is brought into close contact with the substrate W after film formation to measure the totally reflected light. A film 91 has been formed on the pattern 90 after film formation by plasma ALD. For example, in the substrate W, a film 91 is formed in a trench 92. The measurement results of the first measurement step include spectrum information of the prism 51, the substrate W before film formation, and the light source. The measurement results of the second measurement step include spectrum information of the prism 51, the substrate W after film formation, and the light source. The light intensity of the first measurement step is used as the reference light intensity, the light intensity of the second measurement step is used as the light intensity of the sample, and the calculation of the above equation (1) is performed for each wave number to calculate the absorbance spectrum. By doing so, it is possible to cancel the spectrum signals of the prism 51, the substrate W and the light source, and it is possible to calculate the signal of the formed film 91.

In the following, a case where in the first measurement step, the prism 51 is irradiated with infrared light in a state in which the prism 51 is arranged on the substrate W before film formation, and the reflected light totally reflected at the interface between the substrate W and the prism 51 is measured will be described as a main example.

Figure 9:
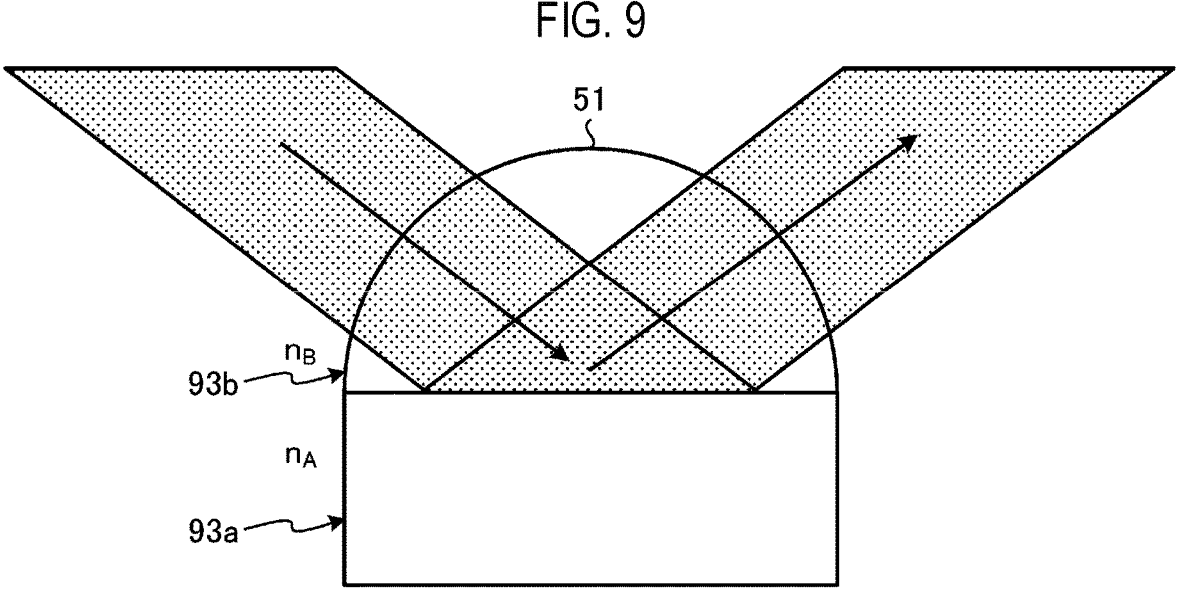
FIG. 9 is a diagram illustrating conditions under which total reflection occurs.

Now, conditions for total reflection to occur at the interface between the substrate W and the prism 51 will be described. FIG. 9 is a diagram illustrating the conditions under which total reflection occurs. In FIG. 9, two layers 93*a* and 93*b* are in contact. The layer 93*b* is, for example, the prism 51. The layer 93*a* is, for example, the substrate W. The conditions of the angle 0 for total reflection to occur at the interface between the layer 93*a* and the layer 93*b* can be determined from the following formula (2).

$$0 \geqq 0_m = \text{Arcsin}(n_a/n_b) \quad (2)$$

In the formula (2), $n_a$ is the refractive index of the layer 93*a*, $n_b$ is the refractive index of the layer 93*b*, and $0_m$ is the critical angle for total reflection.

Figure 10:
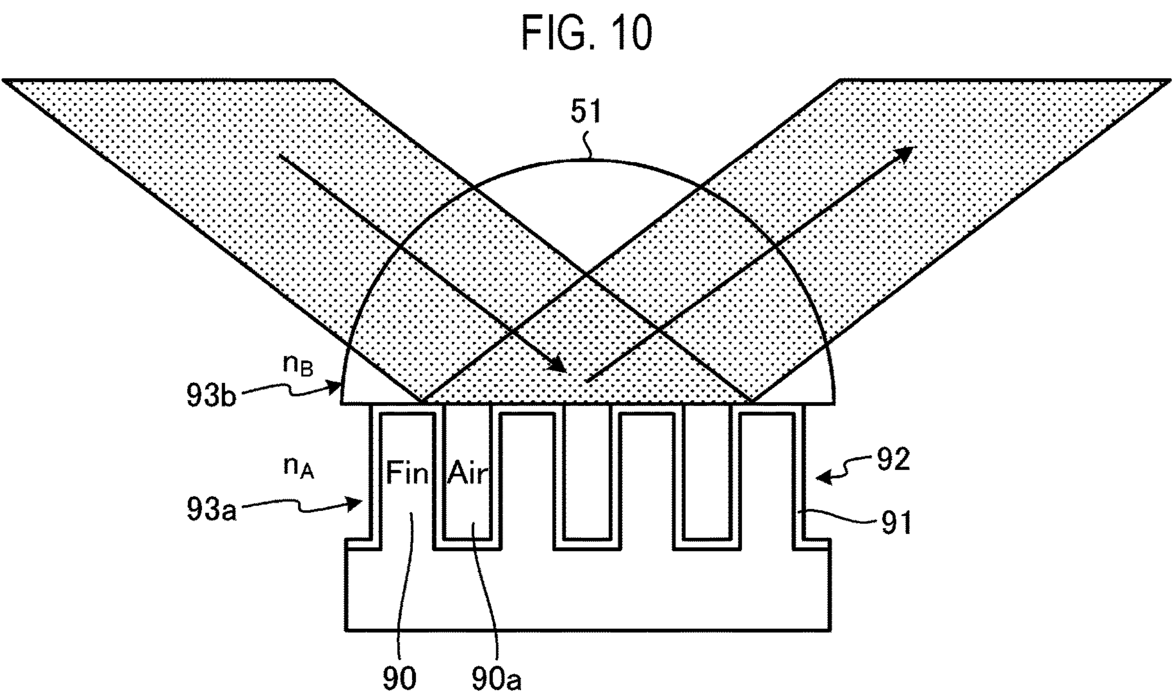
FIG. 10 is a diagram illustrating conditions under which total reflection occurs in a pattern including a recess.

When the pattern 90 including the recesses 90*a* is formed on the substrate W, the conditions for total reflection to occur are as follows. FIG. 10 is a diagram illustrating the conditions under which total reflection occurs in the pattern 90 including the recesses 90*a*. In FIG. 10, the pattern 90 including the recesses 90*a* is formed as a layer 93*a*. A film 91 is formed on the pattern 90.

The refractive index of such an area of the pattern 90 can be determined from the following formula (3).

$$n_{trench}=(n_{fin}\cdot V_{fin}+n_{air}\cdot V_{air}+n_{film}\cdot V_{film})/(V_{fin}+V_{air}+V_{film}) \quad (3)$$

In the formula (3), $n_{trench}$ is the refractive index of the area of the pattern 90, $n_{fin}$ is the refractive index of the protrusion (Fin) between the recesses 90*a*, $V_{fin}$ is the volume of the protrusion between the recesses 90*a*, $n_{air}$ is the refractive index of the recesses 90*a*, i.e., the atmosphere (Air), $V_{air}$ is the volume of the recesses 90*a*, i.e., the atmospheric region, $n_{film}$ is the refractive index of the film 91, and $V_{film}$ is the volume of the film 91.

The conditions of the angle θ for total reflection to occur at the interface between the layer 93*a* on which the pattern 90 including the recesses 90*a* is formed and the layer 93*b* can be determined by replacing the refractive index $n_a$ of the layer 93*a* in the formula (2) with the refractive index $n_{trench}$ of the area of the pattern 90. For example, the pattern 90 has recesses 90*a* having a scale of nanometers to micrometers smaller than the wavelength of infrared light. When the pattern 90 including the recesses 90*a* having a scale smaller than the wavelength of infrared light incident for measurement is formed in this manner, the refractive index of the measurement region can be determined by determining the refractive index $n_{trench}$ in consideration of the shape of the pattern 90. The angle of total reflection at the interface can be determined from the refractive index $n_{trench}$ thus determined.

In the film forming apparatus 100 according to the embodiment, the rotation angles and positions of the mirrors 52*a* and 52*b* are adjusted so that when the prism unit 50 is arranged on the substrate W, total reflection occurs at the interface between the substrate W and the prism 51.

Figure 11:
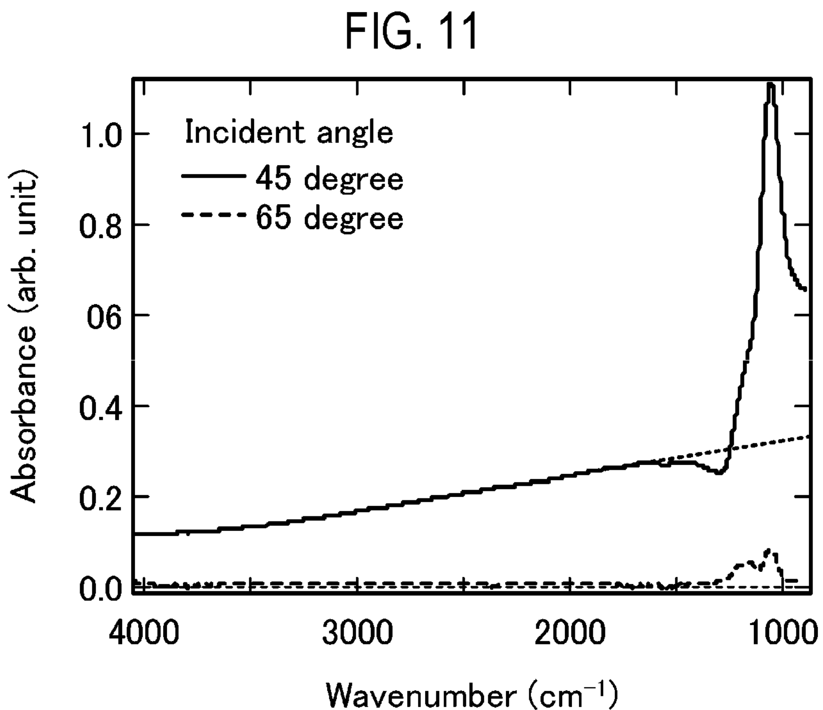
FIG. 11 is a diagram schematically showing an example of shapes of the absorbance spectra when total reflection occurs and when total reflection does not occur in a case where only a prism is used as a reference substance.
Figure 12:
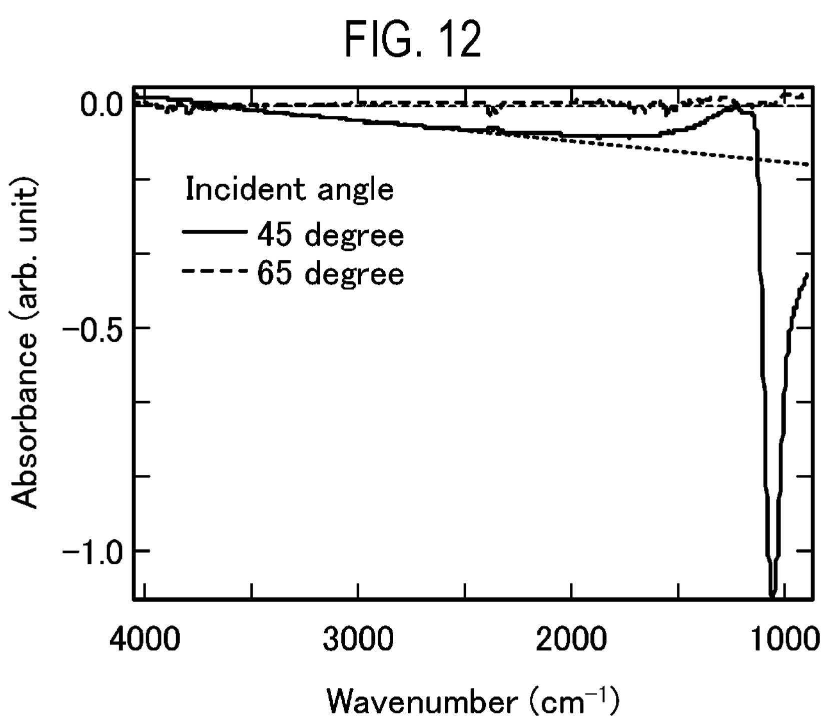
FIG. 12 is a diagram schematically showing an example of shapes of the absorbance spectra when total reflection occurs and when total reflection does not occur in a case where a pre-film-forming sample is used as a reference substance.

The film forming apparatus 100 according to the embodiment may be configured such that the prism unit 50 is provided with a drive mechanism that changes the rotation angles and positions of the mirrors 52*a* and 52*b* so as to be capable of dynamically adjusting the rotation angles and positions of the mirrors 52*a* and 52*b*. For example, the spectral shape of the absorbance spectrum is changed depending on whether the reflection at the interface between the substrate W and the prism 51 is total reflection or not. FIG. 11 is a diagram showing an example of the shape of the absorbance spectrum when total reflection occurs and when total reflection does not occur in the case where only the prism is used as a reference substance. FIG. 12 is a diagram showing an example of the shape of the absorbance spectrum when total reflection occurs and when total reflection does not occur in the case where the pre-film-forming sample is used as a reference substance. In both FIGS. 11 and 12, there is no total reflection at an incident angle of 45 degrees, and there is total reflection at an incident angle of 65 degrees. In the case of total reflection, the distortion of the baseline is small and a peak resulting from optical absorption appears at a wave number where vibrational resonance occurs. On the other hand, when there is no total reflection, the distortion of the baseline is large, a positive peak and a negative peak with respect to the baseline are mixed, and the signal intensity is extremely large. The film forming apparatus 100 may determine whether total reflection is occurring based on the shape of the absorbance spectrum, and may dynamically adjust the rotation angles and positions of the mirrors 52*a* and 52*b* so that total reflection occurs. For example, the controller 60 determines whether total reflection has occurred based on the shape of the absorbance spectrum. If the total reflection has not occurred, the controller 60 may search for total reflection conditions by repeatedly adjusting the rotation angles and positions of the mirrors 52*a* and 52*b* to increase the incident angle and measuring the absorbance spectrum. If the total reflection conditions are found, the controller 60 performs the first measurement step and the second measurement step at that incident angle. The incident angles in the first measurement step and the second measurement step are preferably the same angle, but may be different angles.

Figure 13:
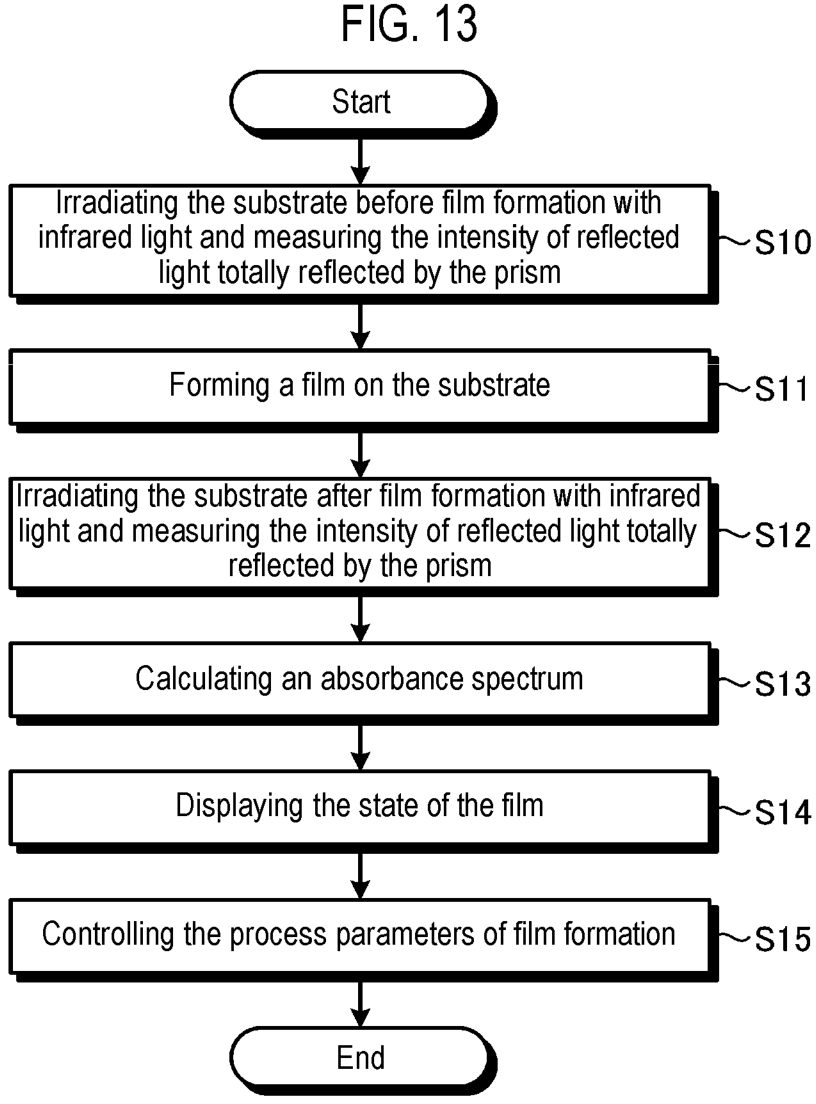
FIG. 13 is a flowchart illustrating an example of a flow of a substrate processing method including a measurement method according to an embodiment.

Next, the flow of a substrate processing method performed by the film forming apparatus 100 according to the embodiment will be described. FIG. 13 is a flowchart illustrating an example of the flow of a substrate processing method including the measurement method according to the embodiment. In the present embodiment, a case where the substrate processing step is a film formation step and a film is formed on the substrate using the substrate processing method will be described as an example.

First, the prism unit 50 is arranged on the substrate W before film formation, the prism 51 of the prism unit 50 is irradiated with infrared light, and the reflected light totally reflected by the prism 51 is measured (step S10). For example, a substrate W having a surface on which a pattern 90 including recesses 90*a* is formed is mounted on the stage 2. Further, the prism unit 50 is transferred, and is arranged on the substrate W by a transfer mechanism (not shown). In the film forming apparatus 100, the controller 60 controls the irradiator 81, the irradiator 81 irradiates the prism 51 of the prism unit 50 with infrared light before film formation, and the detector 82 detects the reflected light totally reflected by the surface of the prism 51 on the substrate W.

Next, a film is formed on the substrate using CVD, ALD, or the like (step S11). For example, the prism unit 50 is transferred, and is removed from above the substrate W by the transfer mechanism (not shown). The controller 60 controls the gas supply 15 and the radio-frequency power source 10 to form a film 91 on the surface of the substrate W by plasma ALD.

Next, the prism unit 50 is arranged on the substrate after film formation, the prism 51 of the prism unit 50 is irradiated with infrared light, and the reflected light totally reflected by the prism 51 is measured (step S12). For example, the prism unit 50 is transferred, and is arranged on the substrate W by the transfer mechanism (not shown). In the film forming apparatus 100, the controller 60 controls the irradiator 81, the irradiator 81 irradiates the prism 51 of the prism unit 50 with infrared light before film formation, and the detector 82 detects the reflected light totally reflected by the surface of the prism 51 on the substrate W.

Next, an absorbance spectrum is calculated from the spectrum of the reflected light before film formation measured in step S10 and the spectrum of the reflected light after film formation measured in step S12 (step S13). For example, the controller 60 determines the spectrum of the reflected light before film formation from the data detected by the detector 82 in step S10. Further, the controller 60 determines the spectrum of the reflected light after film formation from the data detected by the detector 82 in step S12. The controller 60 calculates the absorbance spectrum of the sample after film formation using the reflected light before film formation as reference light. For example, the controller 60 subtracts the spectrum of the common logarithm of the reflected light intensity after film formation from the spectrum of the common logarithm of the reflected light intensity before film formation for each wave number to calculate the absorbance spectrum of the film 91 for each wave number. Thus, as shown in FIG. 8 described above, the signal of the spectrum of the film 91 can be calculated as the absorbance spectrum.

Next, the state of the film formed on the substrate W is displayed based on the calculated absorbance spectrum (step S14). For example, the controller 60 detects chemical bonds contained in the film 91 based on the absorbance spectrum, and displays the detected chemical bonds on the user interface 61.

Furthermore, the process parameters for film formation are controlled based on the calculated absorbance spectrum (step S15). For example, the controller 60 detects chemical 16 bonds contained in the film 91 based on the absorbance spectrum, and controls the process parameters according to the detected chemical bonds.

Figure 14:
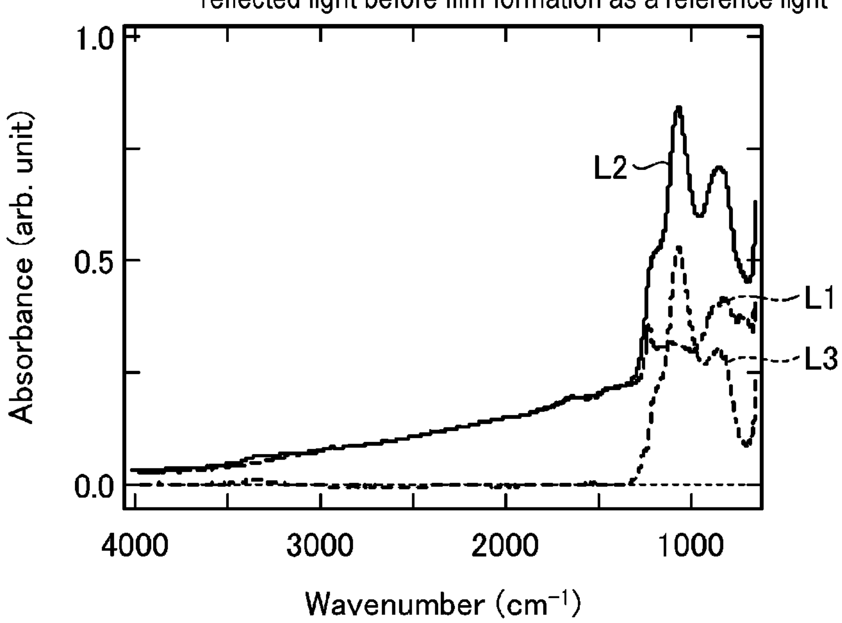
FIG. 14 is a diagram showing an example of spectra according to an embodiment.

FIG. 14 is a diagram showing an example of a spectrum according to the embodiment. The horizontal axis in FIG. 14 indicates the wave number of infrared light. The vertical axis indicates the absorbance of infrared light. In FIG. 14, there are shown a line L1 showing the absorbance spectrum before film formation calculated using the reflected light of the prism alone as a reference light, a line L2 showing the absorbance spectrum after film formation calculated using the reflected light of the prism alone as a reference light, and a line L3 showing the absorbance spectrum after film formation calculated using the reflected light before film formation as a reference light. L3 can also be calculated by L2-L1 as shown in formula (4) below.

$$L2 - L1 = (\log 10 I_{prism} - \log 10 I_{after\ depo}) - (\log 10 I_{prism} - \log 10 I_{before\ depo}) = \log 10 I_{before\ depo} - \log 10 I_{after\ depo} \quad (4)$$

In formula (4), $I_{prism}$ is the reflected light intensity for the prism alone, $I_{before\ depo}$ is the reflected light intensity before film formation, and $I_{after\ depo}$ is the reflected light intensity after film formation.

Figure 15:
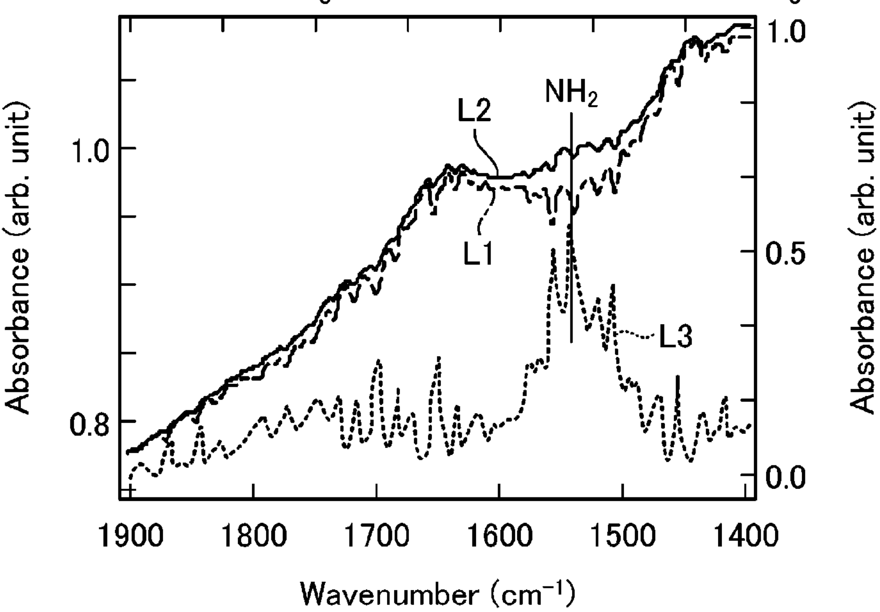
FIG. 15 is an enlarged view of parts of the spectra.

FIG. 15 is an enlarged view of a portion of the spectrum. FIG. 15 indicates a line L1 showing the absorbance spectrum before film formation calculated using the reflected light of the prism alone as a reference light, and a line L2 showing the absorbance spectrum after film formation calculated using the reflected light of the prism alone as a reference light. In FIG. 15, the line L1 and the line L2 are indicated using the absorbance of infrared light on the left vertical axis and the wave number of infrared light on the horizontal axis. Further, FIG. 15 indicates a line L3 showing the absorbance spectrum after film formation calculated using the reflected light before film formation as a reference light. In FIG. 15, the line L3 is indicated using the absorbance of infrared light on the right vertical axis and the wave number of infrared light on the horizontal axis.

When only the prism is used as a reference substance, the absorbance spectrum contains a large signal originating from the substrate W, making it impossible to accurately detect the state of the sample. For example, the lines L1 and L2 in FIGS. 14 and 15 contain large signals originating from the substrate W and weak signals originating from the formed film 91. Furthermore, the baselines of the lines L1 and L2 are not flat, which impedes spectrum analysis such as peak detection and quantification.

Therefore, in the measurement method according to the embodiment, the absorbance spectrum after film formation is calculated using the reflected light intensity before film formation as a reference light intensity. In the absorbance spectrum calculated in this way, the signal of the substrate W is canceled out, and the absorbance is changed at the wave number position corresponding to the compositional component contained in the formed film 91. Thus, the state of the sample can be detected with high accuracy. For example, FIGS. 14 and 15 show the analysis results of a substrate W on which a film 91 containing $NH_2$ is formed. In the line L3 indicating the absorbance spectrum, the absorbance is changed at the wave number position corresponding to $NH_2$. This makes it possible to accurately detect that the formed film 91 contains $NH_2$. Further, the shape of the absorbance spectrum is changed depending on the quality of the formed film 91. For example, the stronger the chemical bonds contained in the film, the higher the peak wave number of the spectrum. Furthermore, the smaller the structural disorder of the film, the smaller the spectral width. This makes it possible to estimate the quality of the formed film 91 from the shape of the absorbance spectrum.

The controller 60 displays the state of the film 91 formed on the substrate W based on the absorbance spectrum. For example, the controller 60 displays the spectrum of the formed film 91 on the user interface 61. Moreover, for example, the controller 60 identifies the substance or chemical bond contained in the film 91 from the absorbance at a wave number position that resonates with the vibration of the substance or chemical bond in the spectrum of the formed film 91, and displays the identified substance and chemical bond on the user interface 61. The controller 60 may estimate the film thickness of the film 91 from the absorbance for each wave number, and may display the estimated film thickness on the user interface 61.

Further, the controller 60 detects the state of the formed film 91 based on the absorbance spectrum, and controls the process parameters according to the detected state of the film 91. For example, when the film 91 is insufficiently oxidized or nitrided, the controller 60 controls the process parameters for film formation so as to promote the reaction. Thus, the film forming apparatus 100 can improve the film quality of the film 91 to be formed on the pattern 90 in subsequent film formation.

By the way, as mentioned above, the depth at which the evanescent wave penetrates depends on the refractive index of the sample. The ATR method performs measurement using the absorption of light that occurs in a region where the evanescent wave penetrates. Therefore, in the ATR method, the detection region is changed depending on the refractive index of the sample. For example, in a substrate W in which a trench 92 is formed as a pattern 90 including recesses 90*a*, the refractive index in the area of the pattern 90 is changed depending on the density of the trenches 92, and the region in which the evanescent wave penetrates is changed. For example, as the density of the trenches 92 increases, the proportion of the recesses 90*a* (atmospheric portions) in the pattern 90 increases, and the refractive index $n_{trench}$ in the area of the pattern 90 expressed by the above formula (3) decreases. As the refractive index $n_{trench}$ in the area of the pattern 90 decreases, the depth at which the evanescent wave penetrates becomes larger.

Figure 16:
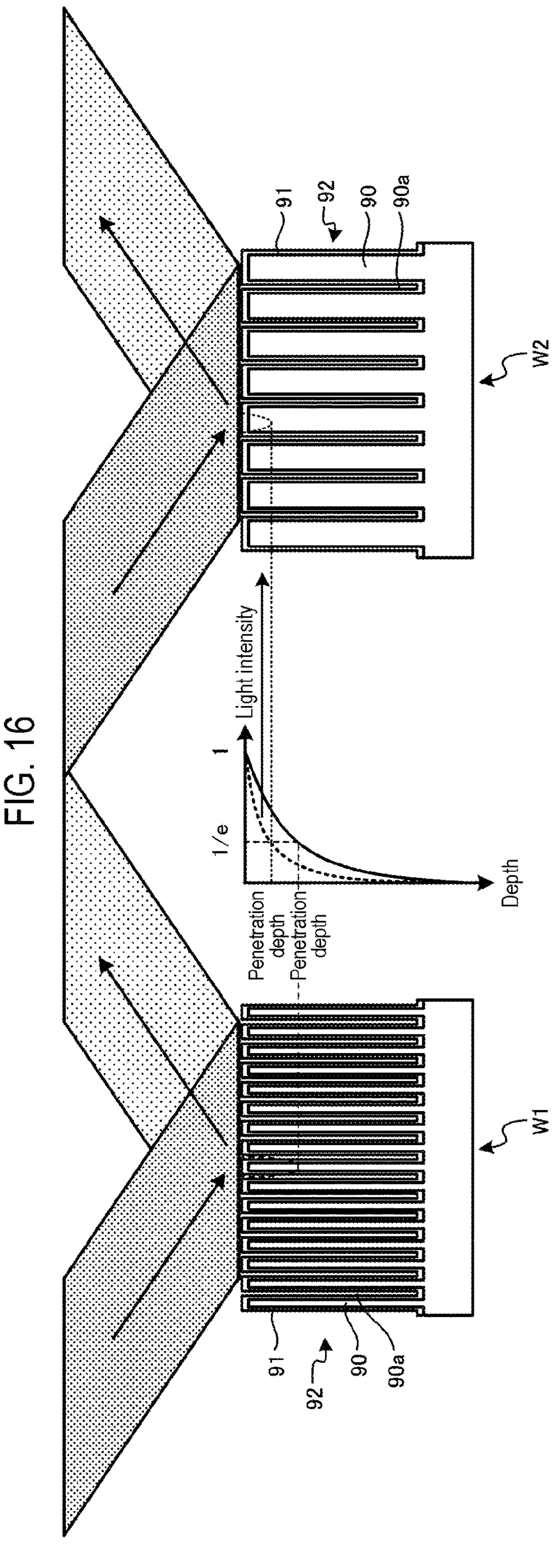
FIG. 16 is a diagram illustrating changes in a depth at which an evanescent wave penetrates according to an embodiment.

FIG. 16 is a diagram illustrating changes in the penetration depth of the evanescent wave according to the embodiment. In FIG. 16, two substrates W1 and W2 are shown. In each of the substrates W1 and W2, a trench 92 is formed as a pattern 90 including recesses 90*a* having similar shapes.

Further, FIG. 16 shows the relationship between the intensity and penetration depth of the evanescent wave penetrating into each of the substrates W1 and W2. The evanescent wave decays exponentially as it penetrates deeper from the surface. The depth at which the evanescent wave penetrates is the depth at which the intensity is 1/e of the intensity at the surface. The substrates W1 and W2 have different densities of trenches 92. The substrate W1 has a higher density of trenches 92 than that of the substrate W2, and the refractive index $n_{trench}$ in the area of the pattern 90 decreases. As a result, the evanescent wave penetrates deeper into the substrate W1 than into the substrate W2.

Depth dependence can be investigated using the fact that the penetration depth depends on the density of the trenches 92. For example, it is possible to analyze the depth dependence by controlling the density of the trenches 92 in the pattern 90 while keeping the shape of the recesses 90*a* (the width and depth of the trenches 92) the same. The measurement method according to the embodiment may further include an analysis step of analyzing depth dependence from the absorbance spectrum of each substrate W calculated in the calculation step. In the measurement method according to the present embodiment, the following process may be performed to analyze depth dependence. In the first measurement step and the second measurement step described above, the plurality of substrates W each having same shaped recesses 90*a* formed at different densities are measured. In the calculation step, for each substrate W, the absorbance spectrum is calculated from a spectrum indicating the absorbance of infrared light for each wave number of the reflected light measured in the first measurement step and a spectrum indicating the absorbance of infrared light for each wave number of the reflected light measured in the second measurement step. In the analysis step, depth dependence is analyzed from the absorbance spectrum for each substrate W calculated in the calculation step.

Figures 17, 18:
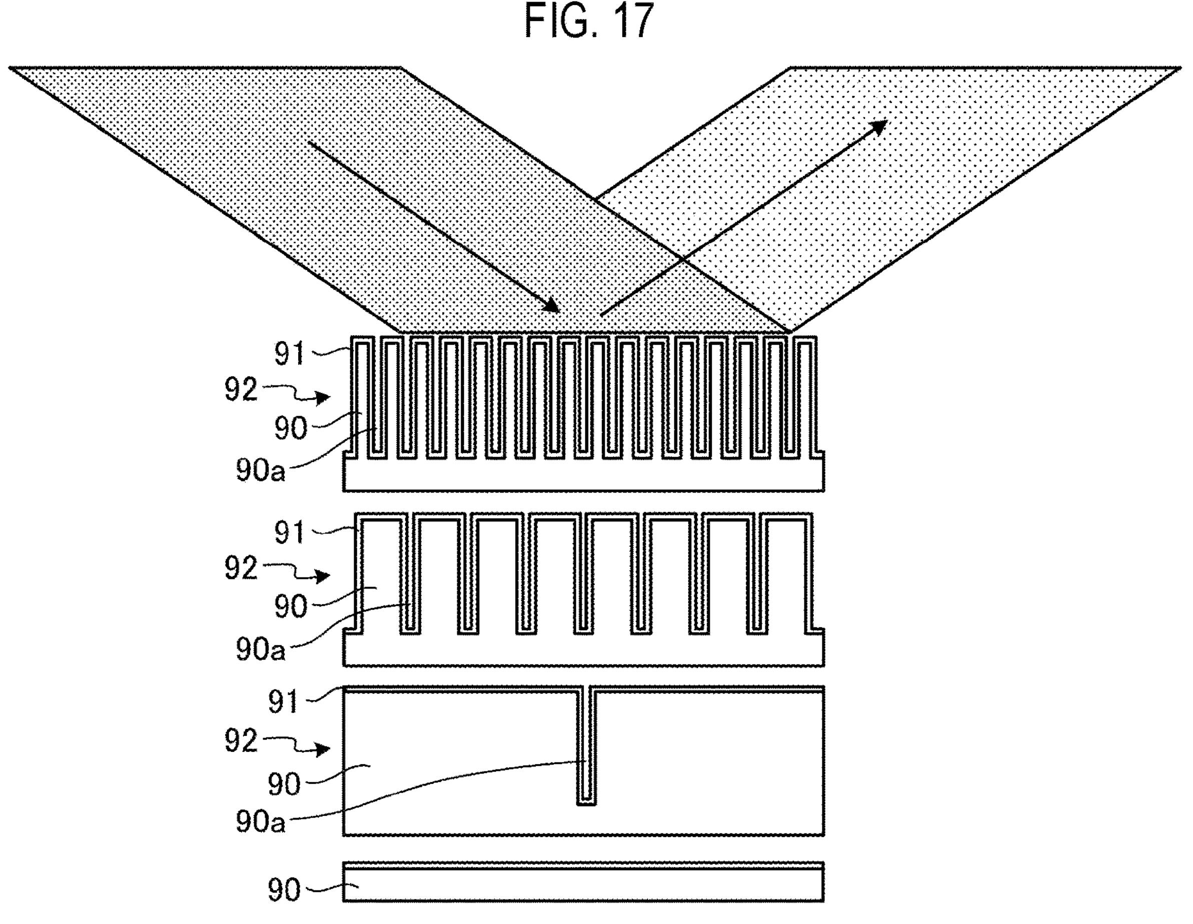
FIG. 17 is a diagram illustrating an analysis of depth dependence according to an embodiment.
FIG. 18 is a diagram showing an example of a refractive index of a pattern and the penetration depth depending on a line-to-space (L/S) ratio.

FIG. 17 is a diagram illustrating depth dependency analysis according to the embodiment. FIG. 17 shows three patterns 90 having the same shape of the recesses 90*a* (the same width and depth of the trench 92) but different densities. Further, FIG. 17 shows a flat pattern 90 in which no trench 92 is formed.

As mentioned above, the penetration depth of the evanescent wave depends on the refractive index of the sample. The depth at which the evanescent wave penetrates can be determined from the following formula (5).

$$dp = \frac{\lambda}{2\pi \cdot n_1} \cdot \frac{1}{\sqrt{\sin^2\theta - (n_2/n_1)^2}} \tag{5}$$

In the formula (5), dp is the depth at which the evanescent wave penetrates, $n_1$ is the refractive index of the prism 51, $n_2$ is the refractive index of the sample, A is the wavelength of infrared light, and 0 is the incident angle of the totally reflected infrared light.

When the sample is the pattern 90, the refractive index $n_2$ of the sample is the refractive index $n_{trench}$ of the area of the pattern 90, and is determined from the above formula (3).

For example, in the case of a non-film-formed pattern 90 having a line-to-space ratio of 1:1 and made of silicon, $V_{fin}$=1, $V_{air}$=1, $V_{film}$=0, and the refractive index $n_{trench}$ is determined by the following formula (6-1).

$$n_{trench} = n_{fin}/2 + n_{air}/2 = 2.2 \tag{6-1}$$

Further, for example, in the case of a non-film-formed pattern 90 having a line-to-space ratio of 1:100 and made of silicon, $V_{fin}$=1, $V_{air}$=100, $V_{film}$=0, and the refractive index $n_{trench}$ is determined by the following formula (6-2).

$$n_{trench} = (n_{fin} \times 100/101) + n_{air}/101 = 3.4 \tag{6-2}$$

As described above, in the pattern 90, the refractive index $n_{trench}$ is changed and the penetration depth is changed depending on the density of the trenches 92. Further, the signal intensity is changed depending on the density of the trenches 92. The larger the penetration depth, the higher the signal intensity. Further, the higher the density of the trenches 92, the more trenches 92. Therefore, the signal intensity at the trench 92 portion becomes higher. When the film 91 exists, the signal intensity is higher at a portion of the film 91 having the higher density of the trenches 92.

Usually, when measuring a silicon wafer using an ATR method, the incident angle 0 of infrared light is about 65 degrees. It is assumed that the wavelength of the infrared light is 1 μm, the incident angle 0 of the totally reflected infrared light is 65 degrees, and the pattern 90 is formed of silicon. The refractive index and the penetration depth of the pattern 90 when setting the line-to-space ratios (L/S) to 1:1, 1:10 and 1:100 are as shown in FIG. 18. FIG. 18 is a diagram showing an example of the refractive index and the penetration depth of the pattern 90 depending on the line-to-space ratio (L/S).

In the film forming process, the amount of film formed on the top surface, side surface, and bottom surface of the trench 92 is changed depending on the density of the trenches 92 in the pattern 90. There is a proportional relationship between the signal intensity of the measured spectrum and the amount of formed film. Therefore, the proportions of the signals of the top surface portion, the side surface portion, and the bottom surface portion in the signal of the absorbance spectrum is changed depending on the density of the trenches 92. For this reason, data of absorbance spectra obtained by measuring substrates W having different densities of trenches 92 cannot be directly compared.

Therefore, in the measurement method according to the present embodiment, data of absorbance spectra obtained by measuring substrates W having different densities of trenches 92 are compared by performing the following process.

Figure 19:
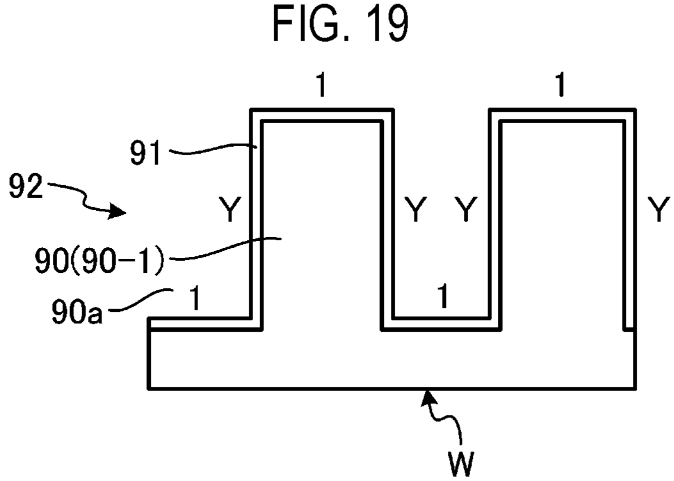
FIG. 19 is a diagram showing an example of a pattern in which trenches have the same width and depth.
Figure 20:
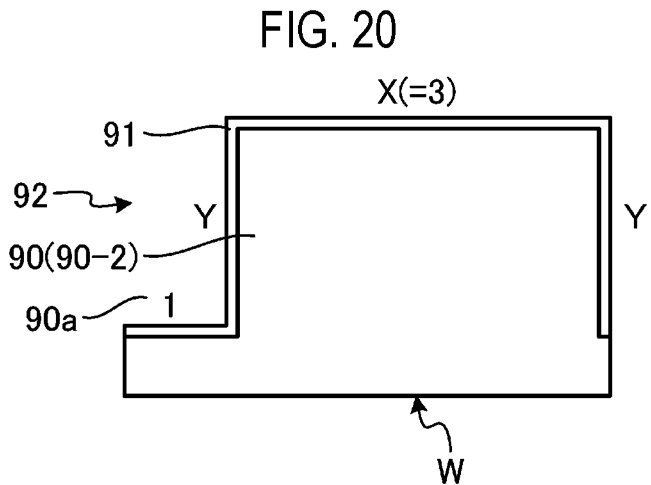
FIG. 20 is a diagram showing an example of a pattern in which trenches have the same width and depth.

FIGS. 19 and 20 are diagrams showing an example of a pattern in which trenches 92 have the same width and depth. FIGS. 19 and 20 show two patterns 90 (90-1 and 90-2) in which the widths and depths of trenches 92 (the shapes of recesses 90*a*) are the same. The patterns 90-1 and 90-2 have the same ratio of the side surface to the bottom surface of the trench 92 of 1:Y, regardless of the density of the trenches 92. On the other hand, in the patterns 90-1 and 90-2, the ratio of the side surface to the top surface of the trench 92 is changed depending on the density of the trenches 92.

Therefore, the analysis is performed so that the ratio of the side surface to the top surface of the trench 92 is the same. It is assumed that the signal of the top surface portion is the same as the signal of the absorbance spectrum obtained by measuring the flat pattern 90 (solid film).

In the pattern 90-2, when the ratio of the top surface to the bottom surface of the trench 92 is 1:X, the signal on the top surface portion is removed by performing the calculation of the following formula (7), whereby the absorbance spectrum signals of the side surface portion and the bottom surface portion can be calculated.

$$\text{Trench signal} = \{\text{flat signal} \times X/(1+X)\} \tag{7}$$

In the formula (7), the trench signal is a signal of an absorbance spectrum obtained by measuring the substrate W having the pattern 90-2. The flat signal is a signal of an absorbance spectrum obtained by measuring the substrate W having a flat pattern 90.

The measurement method according to the embodiment can calculate the signals of the absorbance spectra of the side surface portion and the bottom surface portion of the pattern 90 including the recesses 90*a* by removing the signal of the top surface portion of the pattern 90 including the recesses 90*a* using an absorbance spectrum obtained by measuring the flat pattern 90. Furthermore, in the measurement method according to the embodiment, if the calculated signals of the absorbance spectra of the side surface portion and the bottom surface portion of the pattern 90-2 are standardized by the amount of the formed film 91 according to the density of the trenches 92, it is possible to analyze the depth dependence of the film 91. For example, the film 91 is respectively formed on the patterns 90 having different densities of the trenches 92, and the signals of the absorbance spectra of the side surface portion and the bottom surface portion of the pattern 90 are calculated using the method described above. The depth at which the evanescent wave penetrates depends on the refractive index of the pattern 90. Therefore, the state of the film 91 depending on the depth of the trench 92 can be detected by comparing the signals of the absorbance spectra calculated from the patterns 90 having different densities of the trenches 92. For example, the state of the film 91 at a specific depth can be detected by determining the difference between the absorbance spectra calculated from the patterns 90 having different densities of the trenches 92. Although there has been described the example in which the signal intensity of the top surface portion is removed, it is not necessary to completely remove the signal intensity of the top surface portion as long as the intensity of the top surface portion can be unified, so that data can be compared between pattern samples having different densities. For example, the dependence of trench density may be compared by appropriately standardizing and subtracting the signal of a flat sample so that the ratio of the top surface: the side surface: the bottom surface becomes 1:Y:1.

Figure 21:
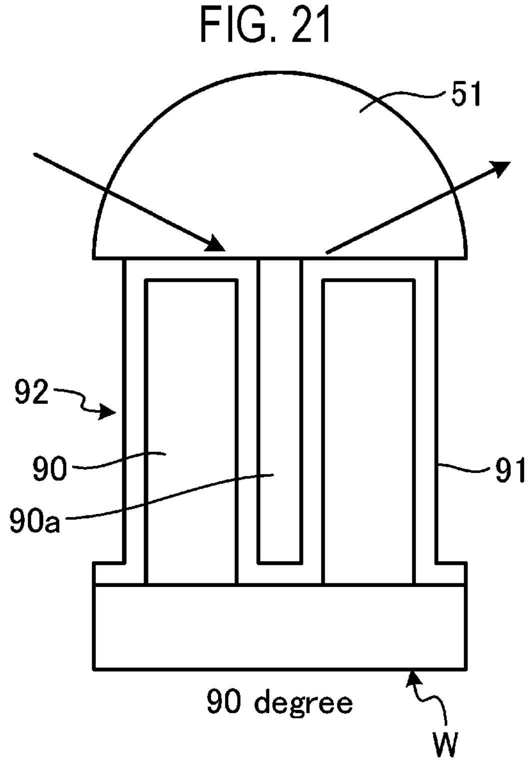
FIG. 21 is a diagram showing an example of an installation angle of a pattern with respect to infrared light.
Figure 22:
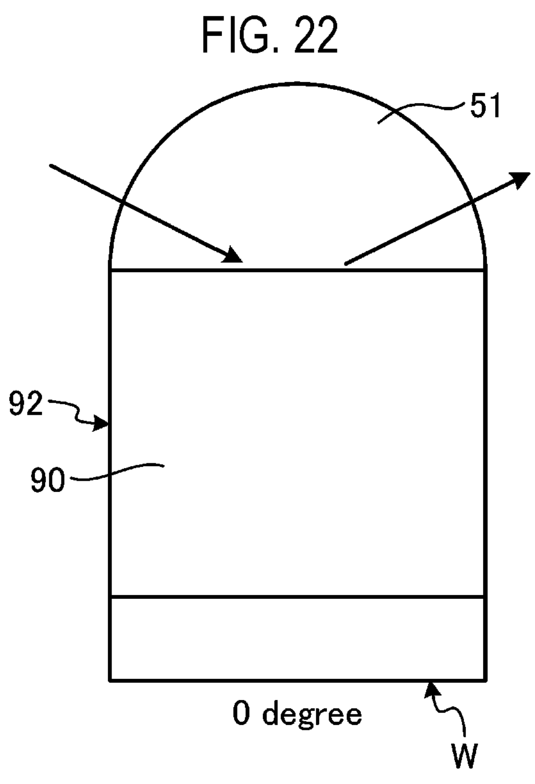
FIG. 22 is a diagram showing an example of an installation angle of a pattern with respect to infrared light.
Figure 23:
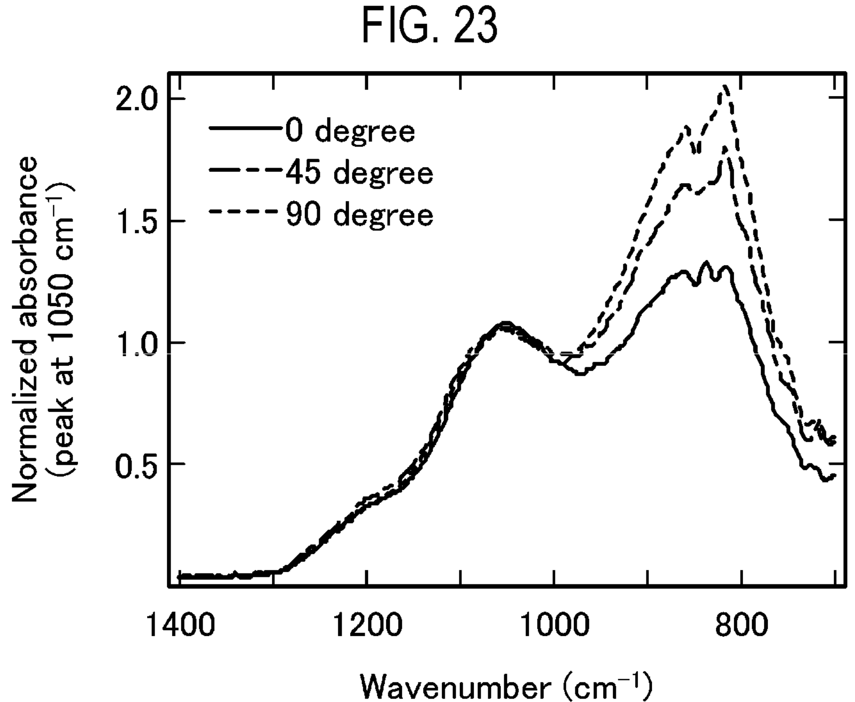
FIG. 23 is a diagram showing an example of changes in spectrum depending an installation angle of a pattern with respect to infrared light.

By the way, unlike the substrate W on which the flat pattern 90 is formed, a substrate W on which a pattern 90 without in-plane isotropy such as a pattern composed of lines and spaces is formed may show in-plane anisotropy in the spectrum measured by ATR. In the substrate W on which the pattern 90 without in-plane isotropy such as a pattern composed of lines and spaces is formed, the spectral shape can be changed by changing the rotation angle about the axis extending in the direction perpendicular to the surface (the azimuth angle of the substrate W) when performing measurement using an ATR method. FIGS. 21 and 22 are diagrams showing examples of installation angles of samples. FIG. 21 shows a case of 90 degree arrangement where lines and spaces are arranged perpendicularly to the light incident plane. FIG. 22 shows a case of 0 degree arrangement where lines and spaces are arranged parallel to the light incident plane. FIG. 23 is a diagram showing an example of a change in spectrum depending on the installation angle of the pattern 90 with respect to infrared light. FIG. 23 shows spectra measured by ATR when the pattern 90 in which the trench 92 is formed is arranged at 0 degrees, 45 degrees, and 90 degrees with respect to infrared light. As shown in FIG. 23, the spectrum is changed by changing the in-plane rotation angle.

The measurement method according to the embodiment can relatively increase the signal intensity of the peak of interest or can relatively weaken the intensity of unnecessary signals by appropriately selecting the installation angle of the sample with respect to infrared light. When calculating the absorbance spectrum, it is necessary to unify the installation angle of the sample with respect to infrared light. For example, in the first measurement step and the second measurement step, the reflected light is measured with the same rotation angle about the axis extending in the direction perpendicular to the surface of the substrate W. This makes it possible to cancel out the signals caused by in-plane anisotropy of the sample. Such changes in the spectrum depending on the installation angle also occur in various spectroscopic methods other than the ATR method. Therefore, even in infrared light analysis measurements other than the ATR, by appropriately selecting the installation angle of the sample with respect to the infrared light, it is possible to relatively increase the intensity of the signal of interest or to weaken unnecessary signals. Furthermore, the signal intensity of the spectrum is changed not only by changing the sample installation angle but also by changing the polarization of the infrared light. Therefore, by appropriately selecting the polarization of infrared light, it is possible to relatively increase the intensity of the signal of interest or to relatively weaken unnecessary signals. Furthermore, by investigating the dependence on the installation angle of the sample, the anisotropy of the sample can be evaluated. Furthermore, if the installation angle of the sample is changed between measuring the reference substance and measuring the sample, the signals caused by anisotropy are not canceled out, and noise is superimposed on the signals of the substrate W and film 91. Therefore, when measuring the sample with anisotropy, it is desirable to set the installation angle of the sample to the same angle when measuring the reference substance and when measuring the sample.

In the measurement method according to the embodiment, when the pattern 90 formed on the substrate W does not have in-plane isotropy, the dependence of the sample on the installation angle may be investigated using the fact that the spectral shape of the absorbance spectrum can be changed by changing the rotation angle about the axis extending in the direction perpendicular to the surface of the substrate W. For example, in the first measurement step and the second measurement step, the reflected light is measured with the same rotation angle about the axis extending in the direction perpendicular to the surface of the substrate W. In the calculation step, the absorbance spectrum is calculated at the same rotation angle based on the intensity spectrum of infrared light for each wave number of reflected light measured in the first measurement step and the intensity spectrum of infrared light for each wave number of reflected light measured in the second measurement step. The measurement method may further include an evaluation step of evaluating the in-plane anisotropy of the sample from the dependence of the absorbance spectrum calculated in the calculation step on the rotation angle about the axis extending in the direction perpendicular to the surface.

An example of investigating the dependence on the installation angle of the sample will be described. For a sample having in-plane anisotropy, the relationship between the angle about the axis extending perpendicular to the surface and the absorbance spectrum is measured in advance, and the relationship between the measured angle and the absorbance spectrum is stored in the memory 62 as relationship data. For example, for a pattern 90 in which lines and spaces are arranged in the same direction, the relationship between the rotation angle and the shape of the absorbance spectrum is stored in the memory 62 as relationship data. The measurement method according to the embodiment calculates the absorbance spectrum by measuring the pattern 90 at various rotation angles about an axis extending in the direction perpendicular to the surface of the substrate W at the same location on the substrate W. The measurement method according to the embodiment evaluates the in-plane anisotropy from the calculated absorbance spectrum for each rotation angle based on the relationship data stored in the memory 62. For example, based on the relationship data stored in the memory 62, the direction of the pattern 90 is specified from the calculated absorbance spectrum for each rotation angle. This makes it possible to evaluate the direction of the pattern 90.

Figure 24:
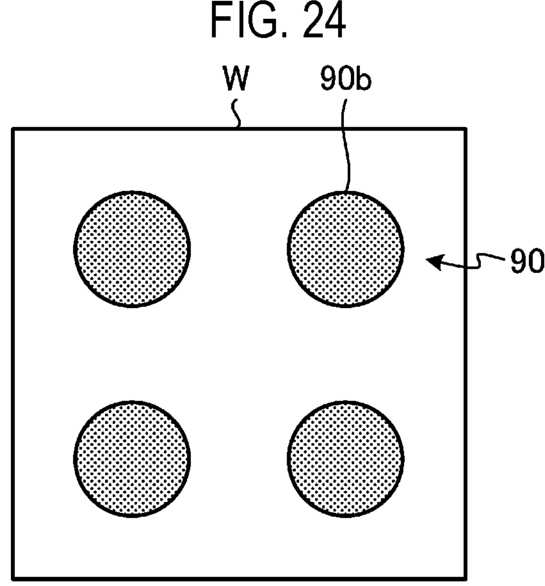
FIG. 24 is a diagram illustrating an example of investigating an installation angle dependence of a sample according to an embodiment.
Figure 25:
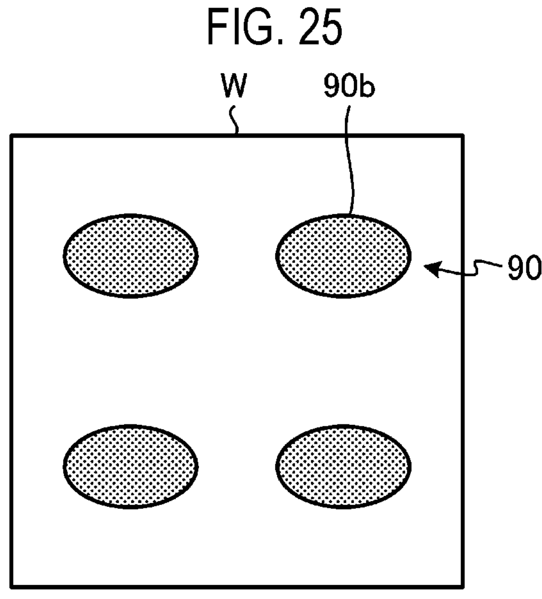
FIG. 25 is a diagram illustrating an example of investigating the installation angle dependence of a sample according to an embodiment.

Another example of investigating the dependence on the installation angle of the sample will be described. The measurement method according to the embodiment calculates the absorbance spectrum by measuring the pattern 90 at various rotation angles about the axis extending in the direction perpendicular to the surface of the substrate W at the same location on the substrate W. The measurement method according to the embodiment evaluates the in-plane isotropy of the pattern 90 based on the calculated absorbance spectrum for each rotation angle. For example, in the first measurement step and the second measurement step, the reflected light is measured at the same location on the substrate W at the same rotation angle while changing the rotation angle about the axis extending in the direction perpendicular to the surface of the substrate W. In the calculation step, the absorbance spectrum is calculated for each rotation angle from the intensity spectrum of infrared light for each wave number of the reflected light measured in the first measurement step and the intensity spectrum of infrared light for each wave number of the reflected light measured in the second measurement step. In the evaluation step, the in-plane isotropy of the pattern 90 is evaluated based on the calculated absorbance spectrum for each rotation angle. FIGS. 24 and 25 are diagrams illustrating an example of investigating the dependence on the installation angle of the sample according to the embodiment. FIGS. 24 and 25 schematically show top views of the pattern 90 formed on the substrate W. A hole-shaped pattern 90 is formed on the substrate W. The pattern 90 shown in FIG. 24 has circular holes 90*b* and has in-plane isotropy. Therefore, in the pattern 90 shown in FIG. 24, the absorbance spectrum for each rotation angle has a similar shape. In the pattern 90 shown in FIG. 25, the holes 90*b* are elliptical and do not have in-plane isotropy. Therefore, in the pattern 90 shown in FIG. 25, the absorbance spectrum for each rotation angle is changed depending on the rotation angle. In the evaluation step, the in-plane isotropy of the pattern 90 (whether the shape is a perfect circle or is distorted like an ellipse) can be evaluated by comparing the calculated absorbance spectra for respective rotation angles and determining the change in the absorbance spectra for respective rotation angles.

Figure 26:
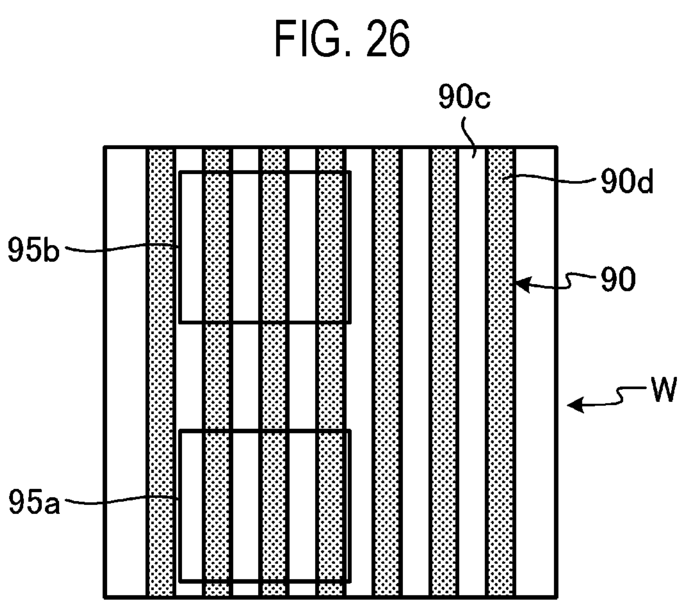
FIG. 26 is a diagram illustrating another example of investigating the installation angle dependence of a sample according to an embodiment.
Figure 27:
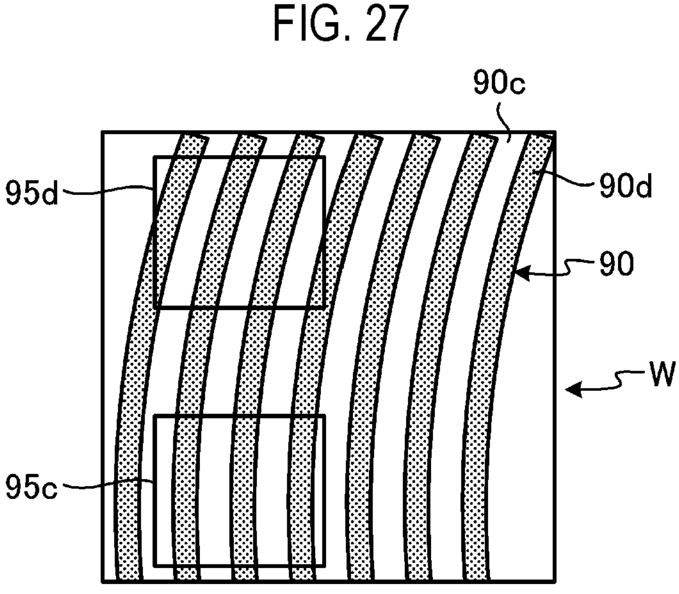
FIG. 27 is a diagram illustrating another example of investigating the installation angle dependence of a sample according to an embodiment.
Figure 28:
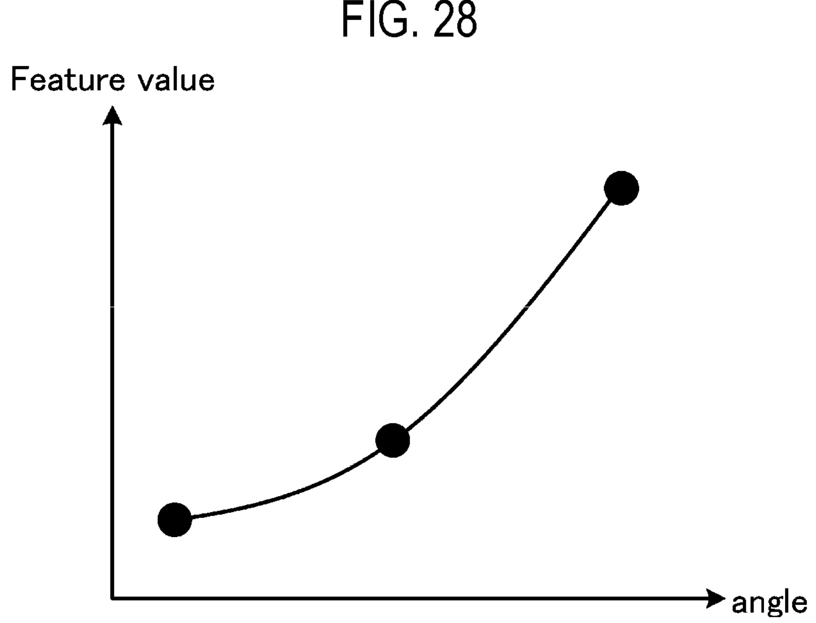
FIG. 28 is a diagram illustrating another example of investigating the installation angle dependence of a sample according to an embodiment.

A further example of investigating the dependence on the installation angle of the sample will be described. The measurement method according to the embodiment calculates the absorbance spectrum by measuring the pattern 90 at various rotation angles about the axis extending in the direction perpendicular to the surface of the substrate W at a plurality of locations on the substrate W. The measurement method according to the embodiment evaluates the in-plane isotropy of the pattern 90 based on the absorbance spectra for each rotation angle calculated at the plurality of locations. For example, in the first measurement step and the second measurement step, the reflected light is measured at a plurality of locations on the substrate W at the same rotation angle while changing the rotation angle about the axis extending in the direction perpendicular to the surface of the substrate W. In the calculation step, the absorbance spectrum is calculated for each rotation angle at a plurality of locations from the intensity spectrum of infrared light for each wave number of reflected light measured in the first measurement step and the intensity spectrum of the infrared light for each wave number of reflected light measured in the second measurement step. In the evaluation step, the in-plane isotropy of the pattern 90 is evaluated based on the absorbance spectra for each rotation angle calculated at a plurality of locations. FIGS. 26 and 27 are diagrams illustrating a further example of investigating the dependence on the installation angle of the sample according to the embodiment. FIGS. 26 and 27 schematically show top views of the pattern 90 formed on the substrate W. The pattern 90 is formed on the substrate W by lines 90*c* and spaces 90*d*. In the pattern 90 shown in FIG. 26, lines 90*c* and spaces 90*d* are arranged in the same direction. Therefore, in the pattern 90 shown in FIG. 26, the absorbance spectra at the same rotation angle have the same shape at the location 95*a* and the location 95*b*. In the pattern 90 shown in FIG. 27, lines 90*c* and spaces 90*d* are both arranged side by side in a curved shape. Therefore, in the pattern 90 shown in FIG. 27, the absorbance spectra at the same rotation angle have different shapes at the location 95*c* and the location 95*d*. In the evaluation step, the linearity of the pattern 90 (whether or not the lines 90*c* are curved) can be evaluated by comparing the absorbance spectra for each rotation angle calculated at a plurality of locations and determining the change in the absorbance spectra for each rotation angle. Moreover, by comparing the absorbance spectra for each rotation angle at a plurality of locations, it is possible to evaluate how the pattern 90 is curved. For example, if the pattern 90 is curved at 45 degrees at the location 95*d*, the 0 degree data at the location 95*c* and the 45 degree data at the location 95*d* match. This makes it possible to evaluate the angle of the curve and whether the pattern 90 is curved to the right or the left. In addition, the anisotropy of the sample can be evaluated by, for example, plotting the angle dependence of the feature value of the absorbance spectrum for each rotation angle at one location and comparing it with the angle dependence of the feature value of the absorbance spectrum for each rotation angle at another location. FIG. 28 is a diagram illustrating a still further example of investigating the dependence on the installation angle of the sample according to the embodiment. FIG. 28 shows the relationship between the rotation angle and the feature value of the absorbance spectrum at the location 95*c*. By comparing the feature value of the absorbance spectrum of the location 95*d* with that shown in FIG. 28, it is possible to evaluate the angle of curve and whether the location 95*d* is curved to the right or the left. Examples of the feature value of the spectrum include the peak intensity, peak area, peak wave number, spectrum width, peak intensity ratio, and area intensity ratio of the spectrum. For example, when the spectrum is changed as shown in FIG. 23, the peak intensity, peak area, peak wave number and spectrum width in the vicinity of 800 $cm^{-1}$, the ratio of the peak intensity at 830 $cm^{-1}$ to the peak intensity at 1050 $cm^{-1}$, and the area intensity ratio of the peak at 830 $cm^{-1}$ to the peak at 1050 $cm^{-1}$ may be used as the feature value of the spectrum.

Further, in the present embodiment, the case where in the first measurement step, the prism 51 is irradiated with infrared light while the prism 51 is arranged on the substrate W before film formation and the reflected light totally reflected at the interface between the substrate W and the prism 51 is measured has been described as a main example. However, the present disclosure is not limited thereto. In the first measurement step, only the prism 51 may be irradiated with infrared light, and the reflected light totally reflected by the prism 51 may be measured. In this case, by calculating the absorbance spectrum from the spectrum measured in the first measurement step and the spectrum measured in the second measurement step, the spectrum information of the prism 51 and the incident light can be cancelled as described above with reference to FIG. 7. Moreover, the signal of the spectrum of the entire substrate W can be calculated as the absorbance spectrum, and the state of the substrate W can be detected.

Figure 29:
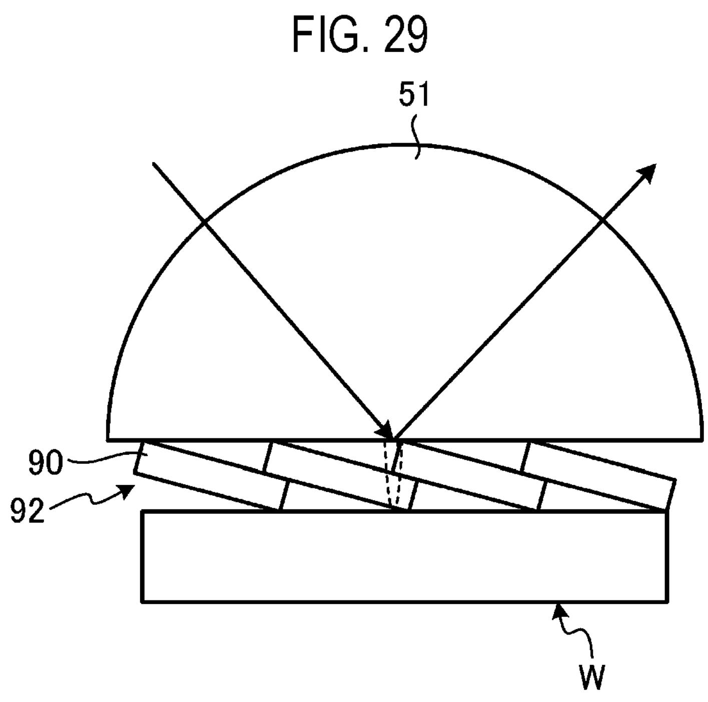
FIG. 29 is a diagram illustrating an example of conducting measurement using an ATR method by collapsing a pattern.

Further, in the present embodiment, the case where the measurement using the ATR method is performed in the film forming apparatus 100 has been described as an example. However, the present disclosure is not limited thereto. The measurement using the ATR method may be performed using an apparatus other than the film forming apparatus 100. For example, the ATR measurement may be performed in a transfer system device such as a transfer module that transfers the substrate W to the film forming apparatus 100 or in other modules. In the measurement using the ATR method, if dust is caught between the substrate W and the prism 51 to create a gap, the signal intensity decreases. For this reason, it is preferable to perform the measurement using the ATR method at a place or a timing at which there are few particles. Further, it is preferable that the ATR measurement is performed by pressing the prism 51 against the substrate W and making it difficult for dust to enter between the prism 51 and the sample. Further, in order to improve the adhesion of the prism 51 to the substrate W, it is preferable to use a prism material that can withstand a high pressure, or to reduce the contact area between the prism and the sample. On the substrate W, if the prism 51 is strongly pressed or if the structure of the pattern 90 is fragile, the pattern 90 may collapse. In order to perform the ATR measurement without destroying the sample, the film forming apparatus 100 or the prism unit 50 may be provided with a mechanism capable of changing the pressure in which the prism 51 is pressed against the substrate W, so that the pressure may be adjustable. Further, the measurement using the ATR method may be performed by intentionally collapsing the pattern 90 by utilizing the prism 51, other pressing devices, surface tension in a cleaning process, or the like. FIG. 29 is a diagram showing an example in which the pattern 90 is collapsed and the measurement using the ATR method is performed. By collapsing the pattern 90 in this manner, it is possible to measure a deeper portion of the trench 92 as compared to a case where the pattern is not collapsed.

Further, in the present embodiment, the case where the prism 51 has a semicircular cross section has been described as an example. However, the present disclosure is not limited thereto. The shape of the prism 51 is not limited to the above-mentioned shape as long as it can totally reflect the incident infrared light can be totally reflected on the surface of the prism 51 on the substrate W. For example, the prism 51 may have a triangular cross section or a trapezoidal cross section.

Further, in the present embodiment, the case where the incident infrared light is totally reflected once on the surface of the prism 51 on the substrate W has been described as an example. However, the present disclosure is not limited thereto. The prism 51 may have a shape that allows the incident infrared light to be totally reflected multiple times on the surface of the prism 51 on the substrate W. For example, as described in Patent Document 1, by making the prism 51 have a trapezoidal cross section, the incident infrared light can be totally reflected multiple times on the surface of the prism 51 on the substrate W.

Figure 30:
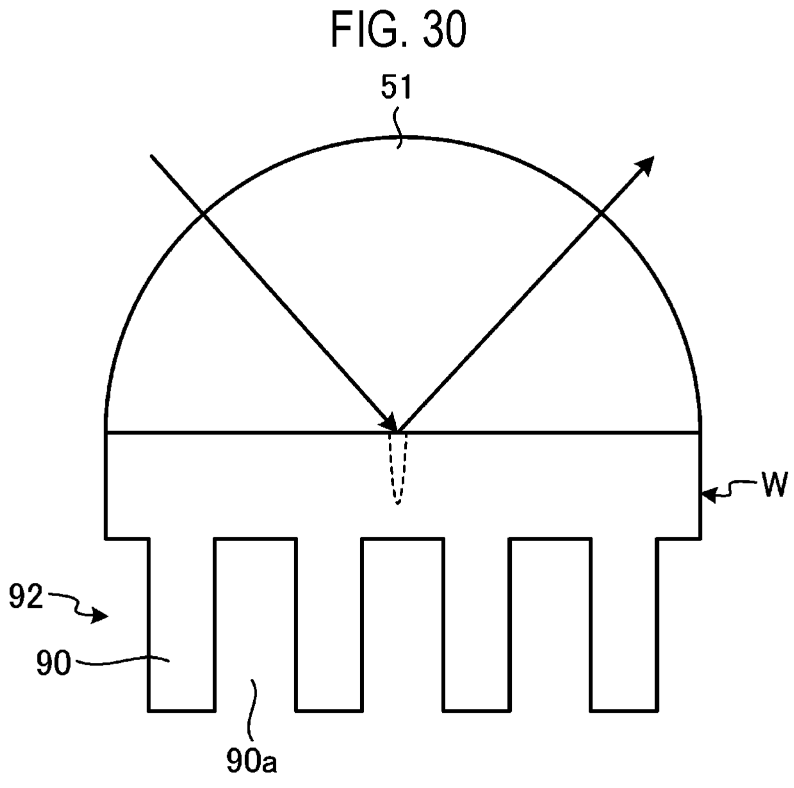
FIG. 30 is a diagram showing an example of measuring a rear surface of a substrate using an ATR method.
Figure 31:
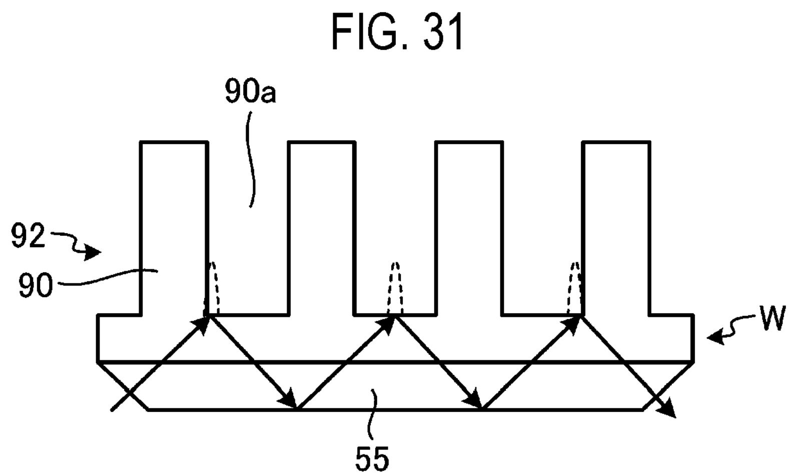
FIG. 31 is a diagram showing an example of detecting the state of a pattern on a rear surface of a substrate.
Figure 32:
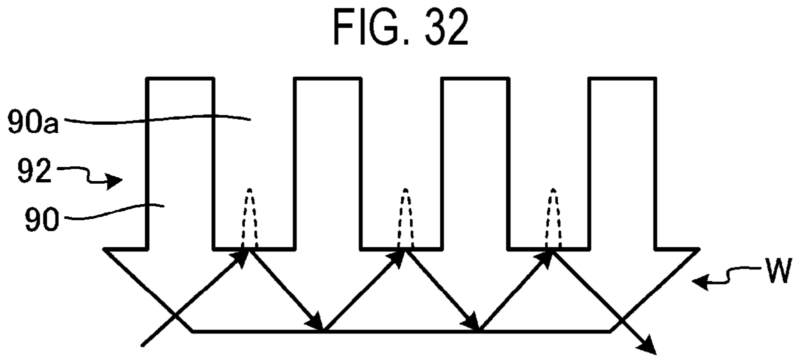
FIG. 32 is a diagram showing an example in which an infrared light is totally reflected within a substrate W to conduct measurement using an ATR method.

Further, in the present embodiment, the case where the prism 51 is arranged on the surface of the substrate W on the pattern 90 side and the measurement using the ATR method is performed has been described as an example. However, the present disclosure is not limited thereto. The prism 51 may be arranged on the rear surface of the substrate W opposite to the surface on the pattern 90 side, and the measurement using the ATR method may be performed. FIG. 30 is a diagram showing an example of measuring the rear surface of the substrate W using the ATR method. By measuring the rear surface of the substrate W using the ATR method in this manner, the state of the sample can be detected from the rear surface side of the substrate W. Further, the state of the pattern 90 may be detected from the rear surface side of the substrate W. FIG. 31 is a diagram showing an example of detecting the state of the pattern 90 from the rear surface side of the substrate W. In FIG. 31, instead of the prism 51, a silicon jig 55 that transmits infrared light is arranged on the rear surface of the substrate W to perform measurement using an ATR. The jig 55 has a trapezoidal cross section, and totally reflects the incident infrared light multiple times on a surface of the jig 55 on the substrate W. By performing such measurement, it is possible to detect the state near the bottom of the recess 90*a* formed in the pattern 90. Further, the measurement using the ATR method may be performed by totally reflecting the infrared light within the substrate W. FIG. 32 is a diagram illustrating an example of performing measurement using the ATR method by totally reflecting infrared light within the substrate W. In FIG. 32, the substrate W is, for example, a silicon wafer that transmits infrared light, and the side surface of the substrate W is cut obliquely. The substrate W totally reflects infrared light incident from the side surface multiple times. By performing such measurement using the ATR, it is possible to detect the state near the bottom of the recess 90*a* formed in the pattern 90.

Furthermore, in the present embodiment, the case where the measurement using the ATR method is performed before and after the film 91 is formed has been described as an example. However, the present disclosure is not limited thereto. The film forming apparatus 100 may perform measurement using an ATR method before and after a specific step during film formation, and may calculate an absorbance spectrum in a specific step. For example, it is assumed that the film forming apparatus 100 forms the film 91 by plasma ALD. In plasma ALD, various steps such as a precursor adsorption step, a modifying step, a reaction step, and an exhaust step are sequentially performed. The film forming apparatus 100 may perform measurement using the ATR method before and after a specific step of plasma ALD, and may calculate an absorbance spectrum in a specific step. Thus, the film forming apparatus 100 can detect the state of a specific step of plasma ALD. Further, when various steps such as a precursor adsorption step, a modifying step, a reaction step, and an exhaust step are repeated multiple times in plasma ALD, the measurement may be performed at the time at which the various steps have been repeated a predetermined number of times. Therefore, the film forming apparatus 100 can detect the state of the film 91 at the time at which the various steps of plasma ALD have been repeated a predetermined number of times. Further, the film forming apparatus 100 may perform real-time monitoring by constantly performing measurement using the ATR method during each step, and obtaining an absorbance spectrum from the spectrum before each step and the spectrum measured in real time. As a result, the film forming apparatus 100 can detect the state of each step of plasma ALD in real time. The controller 60 controls process parameters based on the absorbance spectrum. For example, if adsorption, modification, or reaction is insufficient as a result of detecting the state of adsorption, modification, or reaction from the absorbance spectrum in the adsorption step, the modifying step, or the reaction step, the controller 60 controls the process parameters so as to perform the insufficient step. This makes it possible to suppress the insufficiency of adsorption, modification, and reaction, and to improve the quality of the film 91 to be formed. Further, when a process is performed for an unnecessarily long time, it is possible to shorten the process time and to enhance the productivity. For example, the film forming apparatus 100 may acquire spectrum information of each step by performing measurement using the ATR method before or after each step of plasma ALD, and calculating an absorbance spectrum using the spectrum of the previous step as reference light in each step. As a result, the film forming apparatus 100 can detect the state of each step in real time from the absorbance spectrum of each step.

As described above, the measurement method according to the embodiment includes a first measurement step (step S10), a second measurement step (step S12), and a calculation step (step S13). In the first measurement step, the prism 51 is irradiated with infrared light, and the reflected light totally reflected by the prism 51 is measured. In the second measurement step, infrared light is irradiated onto the prism 51 while the prism 51 is arranged on the substrate W, and the reflected light totally reflected by the surface of the prism 51 on the substrate W is measured. In the calculation step, an absorbance spectrum is calculated from the intensity spectrum of infrared light for each wave number of reflected light measured in the first measurement step and the intensity spectrum of infrared light for each wave number of reflected light measured in the second measurement step. Thus, the measurement method according to the embodiment can cancel noise and spectra caused by the prism 51, the light source, etc., and can detect the state of the sample from the calculated absorbance spectrum. For example, the measurement method according to the embodiment can detect the state of the film 91 formed on the substrate W and the state of the substrate W from the calculated absorbance spectrum.

Moreover, the measurement method according to the embodiment further includes a substrate processing step (step S11). In the first measurement step, the prism 51 is irradiated with infrared light while the prism 51 is arranged on the substrate W before substrate processing, and the intensity of the reflected light totally reflected by the surface of the prism 51 on the substrate W is measured. In the substrate processing step, substrate processing is performed on the substrate W after the first measurement step. In the second measurement step, the prism 51 is irradiated with infrared light while the prism 51 is arranged on the substrate W that has been processed in the substrate processing step, and the reflected light totally reflected at the interface between the substrate W and the prism 51 is measured. As a result, the measurement method according to the embodiment can detect the state of the sample due to substrate processing from the calculated absorbance spectrum. For example, the measurement method according to the embodiment can detect the state of the film 91 formed on the substrate W from the calculated absorbance spectrum.

Moreover, the measurement method according to the embodiment further includes a substrate processing step (step S11). In the first measurement step, only the prism 51 is irradiated with infrared light, and the intensity of the reflected light totally reflected by the prism 51 is measured. In the substrate processing step, substrate processing is performed on the substrate W. In the second measurement step, infrared light is irradiated onto the prism 51 while the prism 51 is arranged on the substrate W after substrate processing, and the reflected light totally reflected at the interface between the substrate W and the prism 51 is measured. As a result, the measurement method according to the embodiment can detect the state of the sample due to the substrate processing from the calculated absorbance spectrum. For example, the measurement method according to the embodiment can detect the state of the substrate W that has been subjected to the substrate processing from the calculated absorbance spectrum.

Further, in the first measurement step and the second measurement step, infrared light is irradiated onto the prism 51 at the same angle of incidence, and the totally reflected light is measured. In this way, by calculating the absorbance spectrum from spectra measured at the same angle of incidence, noise and spectra generated by the prism 51, the light source, etc. can be canceled with high accuracy.

Further, the substrate W is provided with a pattern 90 including recesses 90*a*. Therefore, the state of the sample can be detected from the calculated absorbance spectrum. For example, the measurement method according to the embodiment can detect the state of the recesses 90*a* of the pattern 90 from the calculated absorbance spectrum.

Moreover, the measurement method according to the embodiment further includes an analysis step. In the first measurement step and the second measurement step, a plurality of substrates W each having same shaped recesses 90*a* formed at different densities are measured. In the calculation step, for each substrate W, the absorbance spectrum is calculated from the spectrum showing the absorbance of infrared light for each wave number of the reflected light measured in the first measurement step and the spectrum showing the absorbance of infrared light for each wave number of the reflected light measured in the second measurement step. In the analysis step, depth dependence is analyzed from the absorbance spectrum for each substrate W calculated in the calculation step. As a result, the measurement method according to the embodiment can analyze the depth dependence of the state of the sample.

In the analysis step, using the absorbance spectrum obtained by measuring a flat pattern 90, the absorbance spectra of the side and bottom portions of the pattern 90 are calculated for each substrate W by removing a signal of the upper surface portion of the pattern 90 formed on the substrate W from the absorbance spectrum calculated in the calculation step. In the analysis step, the state of the sample depending on the depth of the pattern 90 is detected by comparing the signals of the calculated absorbance spectra of the side and bottom portions of the pattern 90. As a result, the measurement method according to the embodiment can detect the state of the sample depending on the depth of the pattern 90. For example, the state of the film 91 at a specific depth can be detected.

In the first measurement step and the second measurement step, the reflected light is measured at the same rotation angle about the axis extending in the direction perpendicular to the surface of the substrate W. In the calculation step, the absorbance spectrum is calculated at the same rotation angle from the intensity spectrum of infrared light for each wave number of reflected light measured in the first measurement step and the intensity spectrum of infrared light for each wave number of reflected light measured in the second measurement step. In the evaluation step, the in-plane anisotropy of the sample is evaluated from the dependence of the calculated absorbance spectrum on the rotation angle about the axis extending in the direction perpendicular to the surface of the substrate W. As a result, the measurement method according to the embodiment can evaluate the anisotropy of the sample.

In the calculation step, the absorbance spectrum of infrared light for each wave number is calculated from the spectrum of the common logarithm of the intensity of the reflected light measured in the first measurement step and the spectrum of the common logarithm of the intensity of the reflected light measured in the second measurement step. As a result, the measurement method according to the embodiment can cancel noise and spectra caused by the prism 51, the light source, etc., and can detect the state of the sample from the calculated absorbance spectrum. For example, the measurement method according to the embodiment can detect the state of the film 91 formed on the substrate W and the state of the substrate W from the calculated absorbance spectrum.

Moreover, the measurement method according to the embodiment further includes a display step (step S14). The display step displays the state of the substrate W processed in the substrate processing step based on the absorbance spectrum calculated in the calculation step. As a result, the measurement method according to the embodiment can present the state of the sample. For example, the measurement method according to the embodiment can present the state of the film 91 actually formed on the substrate W to a process manager.

Moreover, the measurement method according to the embodiment further includes a control step (step S15). The control step further includes controlling process parameters of the substrate processing step based on the absorbance spectrum calculated in the calculation step. As a result, the measurement method according to the embodiment can adjust the process parameters according to the state of the sample due to substrate processing, and can improve the state of the sample in subsequent substrate processing. For example, the measurement method according to the embodiment can adjust process parameters according to the state of the film 91 actually formed on the substrate W, and can improve the film quality of the film 91 formed on the substrate W in subsequent film formation.

Although the embodiment has been described above, the embodiment disclosed herein should be considered to be exemplary in all respects and not limitative. Indeed, the embodiment described above may be implemented in various forms. Furthermore, the embodiment described above may be omitted, replaced, or modified in various forms without departing from the scope and spirit of the claims.

Further, in the above-described embodiment, there has been described the case where the prism unit 50 is arranged near the center of the substrate W to perform measurement using the ATR method to detect the state of the film near the center of the substrate W. However, the present disclosure is not limited thereto. For example, the film forming apparatus 100 may be provided with a mechanism that can optically or physically change the measurement location of the ATR method. When performing the measurement using the ATR method on the substrate W, the prism units 50 are arranged at a plurality of locations, such as near the center and the periphery of the substrate W, either in sequence or at the same time. The film forming apparatus 100 may detect the state of the substrate W processed at each of a plurality of locations by irradiating infrared light onto the prism units 50 arranged at the plurality of locations via an optical element provided in the chamber 1, and performing measurement using the ATR method at each location. For example, before and after film formation, measurement using the ATR method is performed at multiple locations within the plane of the substrate W to obtain light spectra. The controller 60 calculates the absorbance spectrum for each of the plurality of locations from the spectrum of light detected on the substrate W before film formation and the spectrum of light detected on the substrate W after film formation. The controller 60 controls the process parameters of the substrate processing step based on the calculated absorbance spectra at a plurality of locations. For example, if the film 91 is insufficiently reacted at any location, the controller 60 controls the process parameters for film formation so as to promote the reaction. The controller 60 may estimate the film thickness at a plurality of locations on the substrate W based on the absorbance spectra at the plurality of locations, and may detect the distribution of the film thickness. Then, the controller 60 may control the process parameters so that the film has a predetermined quality while uniformizing the film thickness distribution. For example, if the thickness distribution of the film 91 is non-uniform and the film 91 is insufficiently reacted at any location, the controller 60 controls the process parameters of film formation to promote the reaction while making the film 91 uniform.

Further, in the above-described embodiment, there has been described the case where the process parameters of the substrate processing step are controlled based on the absorbance spectrum of one substrate W. However, the present disclosure is not limited thereto. The process parameters of the substrate processing step may be controlled based on the comparison of the absorbance spectra between the substrates W from the absorbance spectra of the plurality of substrates W. For example, when the film forming apparatus 100 forms films on a plurality of substrates W, the state of the film to be formed may be changed due to the change over time or the like. Based on the comparison of the absorbance spectra between the substrates W, the controller 60 changes the process parameters of the substrate processing step so as to suppress changes in the state of the film. For example, when the reaction of the film 91 is insufficient, the controller 60 controls the process parameters for film formation so as to promote the reaction. As a result, it is possible to suppress changes in the states of the films formed on the plurality of substrates W.

Further, in the above-described embodiment, there has been described the case where the process parameters of the substrate processing step are controlled based on the absorbance spectrum of one substrate W. However, the present disclosure is not limited thereto. Conditions of the film forming apparatus 100 may be changed over time. Even if film formation is performed under the same film forming conditions (recipe), the state of the film to be formed may be changed. Therefore, the film forming apparatus 100 may form films under the same film forming conditions periodically, such as every few days or at predetermined timing, may perform measurement using the ATR method before and after film formation, and may diagnose the conditions of the film forming apparatus 100 based on the measurement results. For example, the film forming apparatus 100 periodically forms a film on the substrate W under the same film forming conditions. The controller 60 diagnoses the conditions of the film forming apparatus 100 based on the comparison of the absorbance spectra of a plurality of substrates W subjected to film formation under the same film forming conditions. As a result, the film forming apparatus 100 can detect a change in condition from the changes in the states of the films formed under the same film forming conditions.

Further, in the above-described embodiment, the substrate processing apparatus of the present disclosure has been described as an example of a single chamber type film forming apparatus 100 having one chamber. However, the present disclosure is not limited thereto. The substrate processing apparatus of the present disclosure may be a multi-chamber type film forming apparatus having a plurality of chambers.

Figure 33:
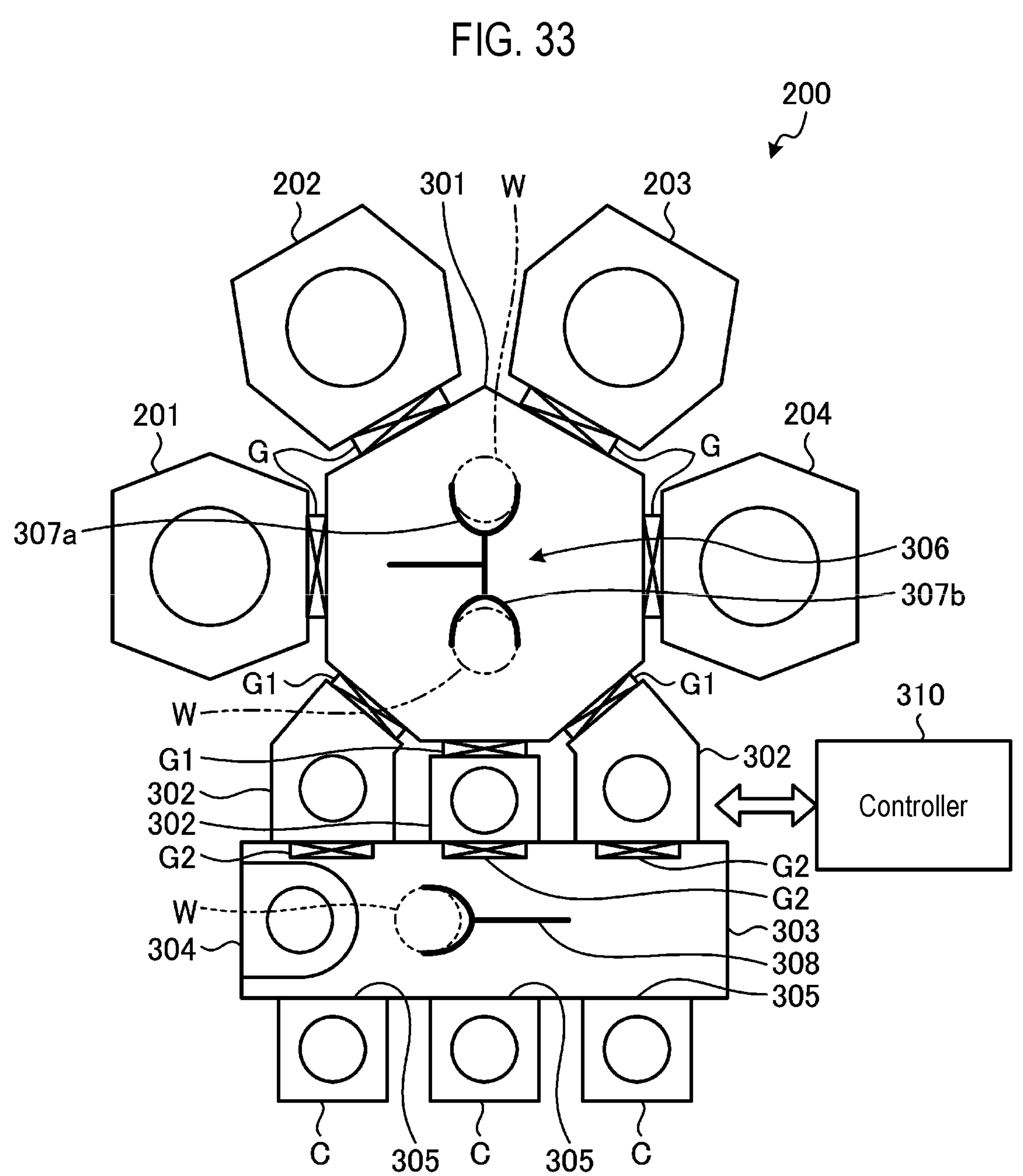
FIG. 33 is a schematic configuration diagram showing another example of the film forming apparatus according to the embodiment.

FIG. 33 is a schematic configuration diagram showing another example of the film forming apparatus 200 according to the embodiment. As shown in FIG. 33, the film forming apparatus 200 is a multi-chamber type film forming apparatus having four chambers 201 to 204. In the film forming apparatus 200, plasma ALD is performed in each of the four chambers 201 to 204.

The chambers 201 to 204 are connected via gate valves G to four walls of the vacuum transfer chamber 301, which has a heptagonal plan-view shape. The inside of the vacuum transfer chamber 301 is evacuated by a vacuum pump and maintained at a predetermined degree of vacuum. Three load lock chambers 302 are connected to the remaining three walls of the vacuum transfer chamber 301 via gate valves G1. An atmospheric transfer chamber 303 is provided on the opposite side of the load lock chambers 302 from the vacuum transfer chamber 301. The three load lock chambers 302 are connected to the atmospheric transfer chamber 303 via gate valves G2. The load lock chambers 302 control the pressure between an atmospheric pressure and a vacuum when the substrate W is transferred between the atmospheric transfer chamber 303 and the vacuum transfer chamber 301.

Three carrier attachment ports 305 for attaching carriers C (such as FOUPs) that accommodate substrates W are provided on the wall of the atmospheric transfer chamber 303 opposite to the wall to which the load lock chamber 302 is attached. Further, an alignment chamber 304 for aligning the substrate W is provided on a side wall of the atmospheric transfer chamber 303. A downflow of a clean air is formed in the atmospheric transfer chamber 303.

A transfer mechanism 306 is provided within the vacuum transfer chamber 301. The transfer mechanism 306 transfers the substrates W to the chambers 201 to 204 and the load lock chambers 302. The transfer mechanism 306 has two independently movable transfer arms 307*a* and 307*b*.

A transfer mechanism 308 is provided within the atmospheric transfer chamber 303. The transfer mechanism 308 transfers the substrate W to the carrier C, the load lock chamber 302, and the alignment chamber 304.

The film forming apparatus 200 includes a controller 310. The operation of the film forming apparatus 200 is generally controlled by the controller 310.

In the film forming apparatus 200 configured in this manner, a measurer for measuring the substrate W by the ATR method may be provided outside the chambers 201 to 204. For example, in the film forming apparatus 200, the measurer for measuring the substrate W using the ATR method is provided in one of the vacuum transfer chamber 301, the load lock chamber 302, the atmospheric transfer chamber 303, and the alignment chamber 304. The measurer includes an irradiator that irradiates infrared light and a detector that detects the infrared light.

When the film forming apparatus 200 performs measurement using the ATR method, the substrate W is arranged in the measurer by the transfer mechanism 306, and the prism 51 is arranged on the surface of the substrate W. The measurer irradiates infrared light from the irradiator onto the prism 51 arranged on the substrate W, and detects the reflected light totally reflected by the surface of the prism 51 on the substrate W using the detector.

The controller 310 uses the measurer to measure the substrate W before film formation. The controller 310 forms a film on the substrate W using one of the chambers 201 to 204. The controller 310 uses the measurer to measure the substrate W after film formation.

The controller 310 calculates the absorbance spectrum from the spectrum of the reflected light before film formation and the spectrum of the reflected light after film formation. As a result, the film forming apparatus 200 can also detect the state of the film formed on the substrate W on which the pattern 90 having the recesses 90*a* is formed.

Further, in the above-described embodiment, there has been described the case where the substrate processing step is a film forming step of forming a film on the substrate W, and the state of the film formed on the substrate W is detected as the state of the substrate W due to the substrate processing by applying the technique of the present disclosure. However, the present disclosure is not limited thereto. The substrate processing step for detecting the state of the substrate W may be, for example, an arbitrary step in a semiconductor manufacturing process for manufacturing a semiconductor device, such as a film forming step, an etching step, a modification step, a resist coating step, a cleaning step, a lithography step, a chemical mechanical polishing step, an inspection step or the like, or may be a plurality of steps including arbitrary combinations of steps. Moreover, from the viewpoint of multiple steps including an arbitrary steps and/or a combination thereof related to a semiconductor manufacturing process, by applying the technique of the present disclosure before and after an arbitrary step or multiple steps, the technique of the present disclosure may also be applied as diagnosis and monitoring within a step and between steps. For example, the technique of the present disclosure may be applied to various triggers (particles, in-plane/inter-plane distribution, etc.) related to semiconductor manufacturing productivity (operation rate, yield, etc.).

Figure 34:
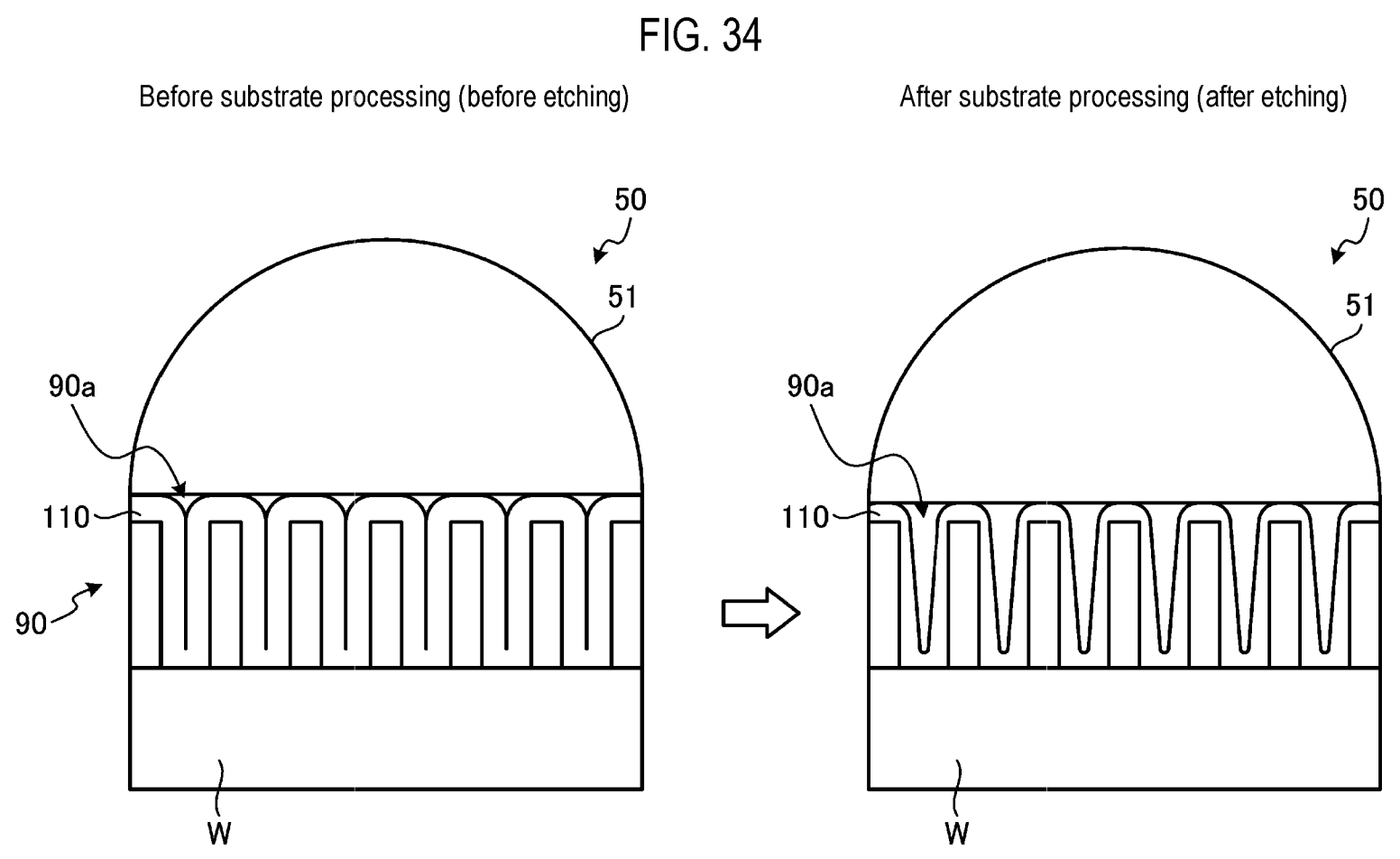
Figure 35:
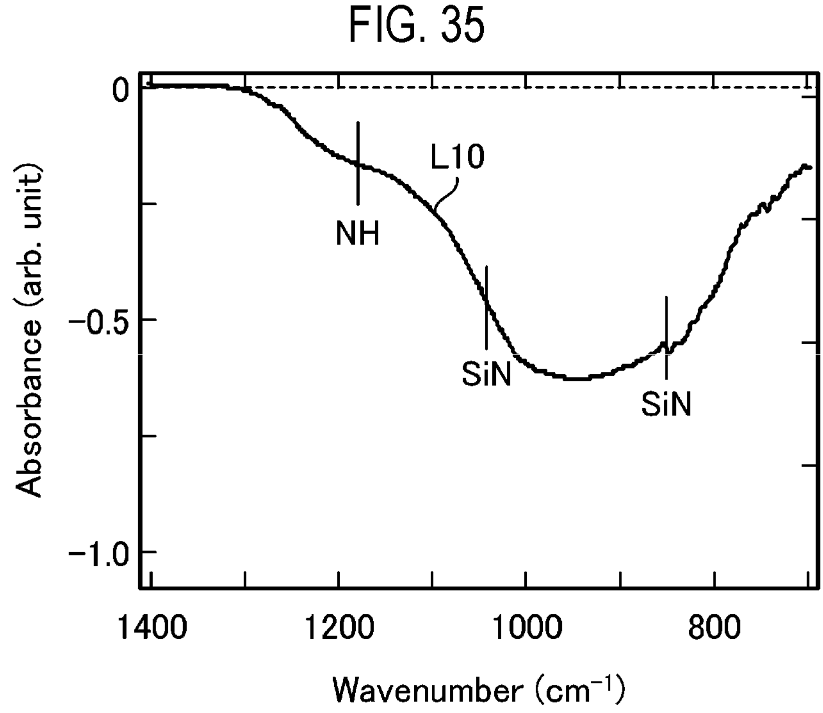
FIG. 35 is a diagram showing an example of an absorbance spectrum according to an embodiment.

Now, an example in which the substrate processing step is other than the film forming step will be described. FIG. 34 is a diagram illustrating an example of the substrate processing step according to the embodiment. FIG. 34 shows a case where the substrate processing step is a dry etching step. In FIG. 34, the left side shows the substrate W before dry etching, and the right side shows the substrate W after dry etching. A pattern 90 including nanoscale recesses 90*a* is formed on the substrate W. A SiN film 110 is formed on the pattern 90. FIG. 34 shows a case where the substrate W is subjected to dry etching using an $NF_3$ gas. The substrate processing apparatus is an etching apparatus that performs dry etching. In the substrate processing method according to the present embodiment, a prism unit 50 is arranged on a substrate W before etching, a prism 51 of the prism unit 50 is irradiated with infrared light, and the reflected light totally reflected by the prism 51 is measured. In the substrate processing method, after the measurement, dry etching is performed on the substrate W as substrate processing. In the substrate processing method, after the dry etching, the prism unit 50 is arranged on the dry etched substrate W, the prism 51 of the prism unit 50 is irradiated with infrared light, and the reflected light totally reflected by the prism 51 is measured. In the substrate processing method, an absorbance spectrum is calculated from an intensity spectrum of infrared light for each wave number of reflected light before etching and an intensity spectrum of infrared light for each wave number of reflected light after etching. FIG. 35 is a diagram showing an example of the absorbance spectrum according to the embodiment. The horizontal axis in FIG. 35 is the wave number of infrared light. The vertical axis is the absorbance of infrared light. In FIG. 35, a line L10 indicating the absorbance spectrum is shown. Further, FIG. 35 shows the positions of wave numbers corresponding to NH and SiN. The substrate processing method according to the present embodiment can detect the state of the substrate W due to substrate processing based on the absorbance spectrum. For example, etching such as dry etching reduces the signal of the etched component in the spectrum. Therefore, in the absorbance spectrum, a signal with a wave number corresponding to the etched component has a negative value. Accordingly, it is possible to detect that the component corresponding to the wave number where the signal has a negative value is the etched component. For example, in FIG. 35, it can be detected that the SiN film 110 containing NH in the film has been etched because the signal on the line L10 decreases at the positions of SiN and NH.

Figure 36:
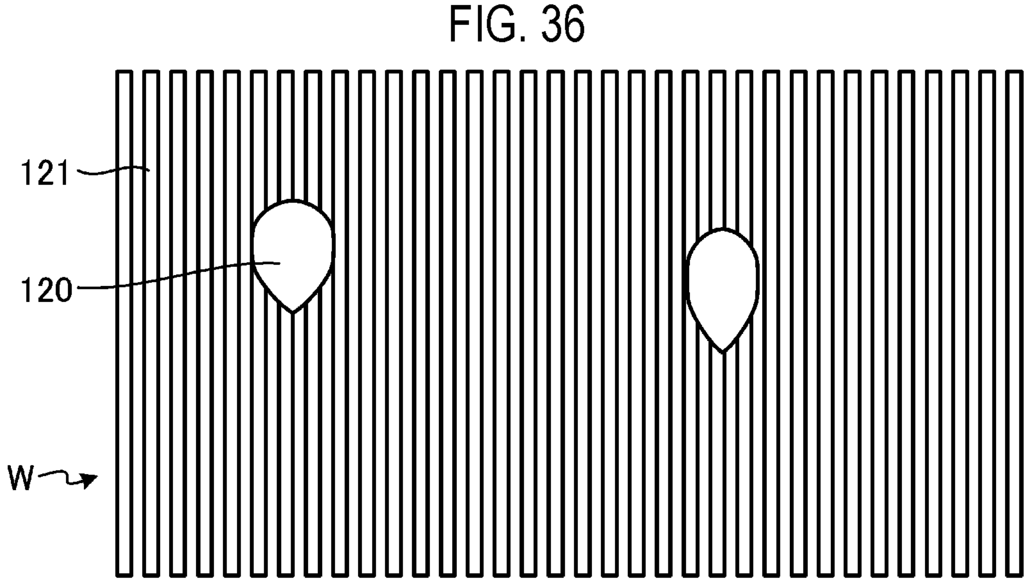
FIG. 36 is a diagram illustrating an example of a substrate processing step according to an embodiment.
Figure 37:
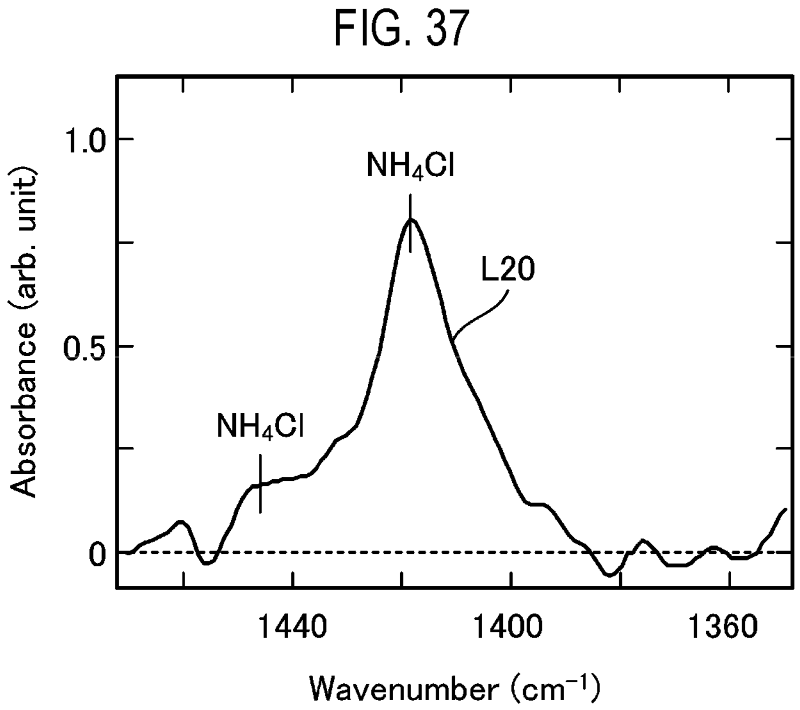
FIG. 37 is a diagram showing an example of an absorbance spectrum according to an embodiment.

FIG. 36 is a diagram illustrating an example of the substrate processing step according to the embodiment. FIG. 36 shows a case where a byproduct 120 is attached to the substrate W due to a substrate processing step such as a film forming step or an etching step. A trench 121 is formed in the substrate W as a pattern including recesses. In the substrate processing method according to the present embodiment, a prism unit 50 is arranged on a substrate W before substrate processing, a prism 51 of the prism unit 50 is irradiated with infrared light, and the reflected light totally reflected by the prism 51 is measured. In the substrate processing method, substrate processing is performed on the substrate W after the measurement. In the substrate processing method, after processing the substrate, the prism unit 50 is arranged on the substrate W after the substrate processing, the prism 51 of the prism unit 50 is irradiated with infrared light, and the reflected light totally reflected by the prism 51 is measured. In the substrate processing method, an absorbance spectrum is calculated from an intensity spectrum of infrared light for each wave number of reflected light before substrate processing and an intensity spectrum of infrared light for each wave number of reflected light after substrate processing. FIG. 37 is a diagram showing an example of the absorbance spectrum according to the embodiment. The horizontal axis in FIG. 37 is the wave number of infrared light. The vertical axis is the absorbance of infrared light. In FIG. 37, a line L20 indicating the absorbance spectrum is shown. Further, FIG. 37 shows the position of the wave number corresponding to $NH_4Cl$. The substrate processing method according to the present embodiment can detect the state of the substrate W due to substrate processing from the absorbance spectrum. For example, the state of the substrate W can be detected depending on whether a change in the signal of an unintended component occurs in the absorbance spectrum as a result of substrate processing. For example, as shown in FIG. 36, if the byproduct 120 adheres to the substrate W, in the absorbance spectrum, a change occurs in the wave number signal corresponding to the component of the byproduct 120. For example, in FIG. 37, a change has occurred in the wave number signal corresponding to $NH_4Cl$, which is a component of the byproduct 120. Thus, the substrate processing method according to the present embodiment can detect that the byproduct 120 has adhered to the substrate W due to the substrate processing.

Further, as described above, the substrate processing apparatus of the present disclosure has been disclosed as an example of a single chamber type substrate processing apparatus or a multi-chamber type substrate processing apparatus having a plurality of chambers. However, the present disclosure is not limited thereto. For example, the substrate processing apparatus of the present disclosure may be a batch type substrate processing apparatus that can process a plurality of substrates at a time, or may be a carousel type semi-batch type substrate processing apparatus.

The embodiments disclosed herein should be considered to be exemplary in all respects and not limitative. Indeed, the embodiments described above may be implemented in various forms. Moreover, the above-described embodiments may be omitted, replaced, or modified in various forms without departing from the scope and spirit of the appended claims.

Regarding the above-described embodiments, the following supplementary notes are further disclosed.

(Supplementary Note 1)

A measurement method, comprising:

a first measurement step of irradiating a prism with infrared light and measuring reflected light totally reflected by the prism;

a second measurement step of irradiating the prism with infrared light while the prism is arranged on a substrate and measuring reflected light totally reflected by a surface of the prism on the substrate; and a calculation step of calculating an absorbance spectrum from an intensity spectrum of infrared light for each wave number of the reflected light measured in the first measurement step and an infrared light for each wave number of the reflected light measured in the second measurement step.

(Supplementary Note 2)

The measurement method of Supplementary Note 1, wherein in the first measurement step, the prism is irradiated with infrared light while the prism is arranged on the substrate before substrate processing, and an intensity of reflected light totally reflected by the surface of the prism on the substrate is measured, further comprising: a substrate processing step of performing the substrate processing on the substrate after the first measurement step, and wherein in the second measurement step, the prism is irradiated with infrared light while the prism is arranged on the substrate processed in the substrate processing step, and an intensity of reflected light totally reflected at an interface between the substrate and the prism is measured.

(Supplementary Note 3)

The measurement method of Supplementary Note 1, wherein in the first measurement step, only the prism is irradiated with infrared light, and an intensity of reflected light totally reflected by the prism is measured, further comprising: a substrate processing step of performing a substrate processing on the substrate, and wherein in the second measurement step, the prism is irradiated with infrared light while the prism is arranged on the substrate after the substrate processing, and an intensity of reflected light totally reflected at an interface between the substrate and the prism is measured.

(Supplementary Note 4)

The measurement method of any one of Supplementary Notes 1 to 3, wherein in the first measurement step and the second measurement step, the prism is irradiated with infrared light at the same angle of incidence, and the reflected light totally reflected by the prism is measured.

(Supplementary Note 5)

The measurement method of any one of Supplementary Notes 1 to 4, wherein a pattern including a recesses is formed in the substrate.

(Supplementary Note 6)

The measurement method of any one of Supplementary Notes 1 to 5, wherein in the first measurement step and the second measurement step, each of a plurality of substrates on which recesses having the same shape are formed at different densities is measured, wherein in the calculation step, for each of the plurality of substrates, the absorbance spectrum is calculated from the intensity spectrum of infrared light for each wave number of the reflected light measured in the first measurement step and the intensity spectrum of infrared light for each wave number of the reflected light measured in the second measurement step, and further comprising: an analysis step of analyzing depth dependence based on the absorbance spectrum for each of the plurality of substrates calculated in the calculation step.

(Supplementary Note 7)

The measurement method of Supplementary Note 6, wherein in the analysis step, an absorbance spectrum obtained by measuring a flat pattern is used to detect a state of a sample depending on a depth of a pattern formed in each of the plurality of substrates by, for each substrate, removing a signal of an upper portion of the pattern formed on the substrate from the absorbance spectrum calculated in the calculation step, calculating absorbance spectra of a side portion and a bottom portion of the pattern, and comparing signals of the calculated absorbance spectra of the side portion and the bottom portion of the pattern.

(Supplementary Note 8)

The measurement method of any one of Supplementary Notes 1 to 5, wherein in the first measurement step and the second measurement step, the reflected light is measured with the same rotation angle about an axis extending in a direction perpendicular to the surface of the substrate.

(Supplementary Note 9)

The measurement method of Supplementary Note 8, wherein in the calculation step, the absorbance spectrum is calculated at the same rotation angle from the intensity spectrum of infrared light for each wave number of the reflected light measured in the first measurement step and the intensity spectrum of infrared light for each wave number of the reflected light measured in the second measurement step, and further comprising: an evaluation step of evaluating in-plane anisotropy of a sample from a dependence of the calculated absorbance spectrum on the same rotation angle about the axis extending in the direction perpendicular to the surface of the substrate.

(Supplementary Note 10)

The measurement method of any one of Supplementary Notes 1 to 9, wherein in the calculation step, the absorbance spectrum of infrared light for each wave number is calculated by subtracting a spectrum of a common logarithm of an intensity of the reflected light measured in the second measurement step from a spectrum of a common logarithm of an intensity of the reflected light measured in the first measurement step.

(Supplementary Note 11)

The measurement method of Supplementary Note 2 or 3, further comprising: a display step of displaying a state of the substrate processed in the substrate processing step based on the absorbance spectrum calculated in the calculation step.

(Supplementary Note 12)

The measurement method of Supplementary Note 2, 3 or 11, further comprising: a control step of controlling process parameters of the substrate processing step based on the absorbance spectrum calculated in the calculation step.

(Supplementary Note 13)

The measurement method of Supplementary Note 12, wherein in the control step, the process parameters of the substrate processing step are controlled based on a comparison of absorbance spectra between a plurality of substrates from the absorbance spectra of the plurality of substrates.

(Supplementary Note 14)

The measurement method of Supplementary Note 12, wherein each of the first measurement step and the second measurement step is performed at a plurality of locations within a plane of the substrate, and wherein in the control step, absorbance spectra are calculated at the plurality of locations from the intensity spectrum of the reflected light measured in the first measurement step and the intensity spectrum of the reflected light measured in the second measurement step, and the process parameters are controlled based on the absorbance spectra calculated at the plurality of locations.

(Supplementary Note 15)

The measurement method of Supplementary Note 14, wherein the substrate processing step is a step of forming a film on the substrate, and wherein in the control step, a film thickness distribution and a film quality of the film formed on the substrate are determined from the absorbance spectra calculated at the plurality of locations, and the process parameters are controlled so that a predetermined film quality is obtained while the film thickness distribution is made uniform.

(Supplementary Note 16)

The measurement method of Supplementary Note 2 or 3, wherein the substrate processing step includes periodically performing the substrate processing on the substrate under the same processing conditions, and further comprising: a diagnosis step of diagnosing a condition of an apparatus that performs the substrate processing step based on a comparison of absorbance spectra between a plurality of substrates from the absorbance spectra of the plurality of substrates processed under the same processing conditions.

(Supplementary Note 17)

A substrate processing apparatus, comprising:

a stage configured to mount a substrate;

a substrate processor configured to perform a substrate processing on the substrate;

a measurer configured to irradiate a prism arranged on the substrate with infrared light and measure an intensity of reflected light totally reflected on a surface of the prism on the substrate; and a controller configured to perform a control including: causing the measurer to irradiate the substrate before the substrate processing with infrared light and measure reflected light totally reflected on the surface of the prism on the substrate; causing the substrate processor to perform the substrate processing on the substrate; causing the measurer to irradiate the substrate after the substrate processing with infrared light and measure reflected light totally reflected on the surface of the prism on the substrate; and calculating an absorbance spectrum from the intensity spectrum of infrared light for each wave number of the measured reflected light before the substrate processing and an intensity spectrum of infrared light for each wave number of the measured reflected light after the substrate processing.

EXPLANATION OF REFERENCE NUMERALS

W: substrate, 1: chamber, 2: stage, 6: lift pin, 10: radio-frequency power source, 15: gas supply, 16: shower head, 50: prism unit, 51: prism, 52*a*, 52*b*: mirror, 60: controller, 61: user interface, 62: memory, 80*a*: window, 80*b*: window, 81: irradiator, 82: detector, 90: pattern, 90*a*: recess, 91: film, 100: film forming apparatus, 200: film forming apparatus, 201 to 204: chamber

What is claimed is:

1. A measurement method, comprising:

a first measurement step of irradiating a prism with infrared light and measuring reflected light totally reflected by the prism;

a second measurement step of irradiating the prism with infrared light while the prism is arranged on a substrate and measuring reflected light totally reflected by a surface of the prism on the substrate; and a calculation step of calculating an absorbance spectrum from an intensity spectrum of infrared light for each wave number of the reflected light measured in the first measurement step and an intensity spectrum of infrared light for each wave number of the reflected light measured in the second measurement step, wherein in the first measurement step and the second measurement step, each of a plurality of substrates on which recesses having a same shape are formed at different densities is measured, wherein in the calculation step, for each of the plurality of substrates, the absorbance spectrum is calculated from the intensity spectrum of infrared light for each wave number of the reflected light measured in the first measurement step and the intensity spectrum of infrared light for each wave number of the reflected light measured in the second measurement step, and wherein the measurement method further comprises: an analysis step of analyzing depth dependence based on the absorbance spectrum for each of the plurality of substrates calculated in the calculation step.

2. The measurement method of claim 1, wherein in the first measurement step, the prism is irradiated with infrared light while the prism is arranged on the substrate before a substrate processing, and an intensity of reflected light totally reflected by the surface of the prism on the substrate is measured, the measurement method further comprising: a substrate processing step of performing the substrate processing on the substrate after the first measurement step, and wherein in the second measurement step, the prism is irradiated with infrared light while the prism is arranged on the substrate processed in the substrate processing step, and an intensity of reflected light totally reflected at an interface between the substrate and the prism is measured.

3. The measurement method of claim 2, further comprising: a display step of displaying a state of the substrate processed in the substrate processing step based on the absorbance spectrum calculated in the calculation step.

4. The measurement method of claim 2, further comprising: a control step of controlling process parameters of the substrate processing step based on the absorbance spectrum calculated in the calculation step.

5. The measurement method of claim 4, wherein in the control step, the process parameters of the substrate processing step are controlled based on a comparison of absorbance spectra between a plurality of substrates from the absorbance spectra of the plurality of substrates.

6. The measurement method of claim 4, wherein each of the first measurement step and the second measurement step is performed at a plurality of locations within a plane of the substrate, and wherein in the control step, absorbance spectra are calculated at the plurality of locations from the intensity spectrum of the reflected light measured in the first measurement step and the intensity spectrum of the reflected light measured in the second measurement step, and the process parameters are controlled based on the absorbance spectra calculated at the plurality of locations.

7. The measurement method of claim 6, wherein the substrate processing step is a step of forming a film on the substrate, and wherein in the control step, a film thickness distribution and a film quality of the film formed on the substrate are determined from the absorbance spectra calculated at the plurality of locations, and the process parameters are controlled so that a predetermined film quality is obtained while the film thickness distribution is made uniform.

8. The measurement method of claim 2, wherein the substrate processing step includes periodically performing the substrate processing on the substrate under same processing conditions, and the measurement method further comprising: a diagnosis step of diagnosing a condition of an apparatus that performs the substrate processing step based on a comparison of absorbance spectra between a plurality of substrates from the absorbance spectra of the plurality of substrates processed under the same processing conditions.

9. The measurement method of claim 1, wherein in the first measurement step and the second measurement step, the prism is irradiated with infrared light at a same angle of incidence, and the reflected light totally reflected by the prism is measured.

10. The measurement method of claim 1, wherein a pattern including a recess is formed in the substrate.

11. The measurement method of claim 1, wherein in the analysis step, an absorbance spectrum obtained by measuring a flat pattern is used to detect a state of a sample depending on a depth of a pattern formed in each of the plurality of substrates by, for each substrate, removing a signal of an upper portion of the pattern formed on the substrate from the absorbance spectrum calculated in the calculation step, calculating absorbance spectra of a side portion and a bottom portion of the pattern, and comparing signals of the calculated absorbance spectra of the side portion and the bottom portion of the pattern.

12. The measurement method of claim 1, wherein in the first measurement step and the second measurement step, the reflected light is measured with a same rotation angle about an axis extending in a direction perpendicular to the surface of the substrate.

13. The measurement method of claim 12, wherein in the calculation step, the absorbance spectrum is calculated at the same rotation angle from the intensity spectrum of infrared light for each wave number of the reflected light measured in the first measurement step and the intensity spectrum of infrared light for each wave number of the reflected light measured in the second measurement step, and the measurement method further comprising: an evaluation step of evaluating in-plane anisotropy of a sample from a dependence of the calculated absorbance spectrum on the rotation angle about the axis extending in the direction perpendicular to the surface of the substrate.

14. The measurement method of claim 1, wherein in the calculation step, the absorbance spectrum of infrared light for each wave number is calculated by subtracting a spectrum of a common logarithm of an intensity of the reflected light measured in the second measurement step from a spectrum of a common logarithm of an intensity of the reflected light measured in the first measurement step.

15. A measurement method, comprising:

a first measurement step of irradiating a prism with infrared light and measuring reflected light totally reflected by the prism;

a second measurement step of irradiating the prism with infrared light while the prism is arranged on a substrate and measuring reflected light totally reflected by a surface of the prism on the substrate;

a calculation step of calculating an absorbance spectrum from an intensity spectrum of infrared light for each wave number of the reflected light measured in the first measurement step and an intensity spectrum of infrared light for each wave number of the reflected light measured in the second measurement step; and a substrate processing step of performing a substrate processing on the substrate, wherein in the first measurement step, only the prism is irradiated with infrared light, and an intensity of reflected light totally reflected by the prism is measured, and wherein in the second measurement step, the prism is irradiated with infrared light while the prism is arranged on the substrate after the substrate processing, and an intensity of reflected light totally reflected at an interface between the substrate and the prism is measured.

16. A substrate processing apparatus, comprising:

a stage configured to mount a substrate;

a substrate processor configured to perform a substrate processing on the substrate;

a measurer configured to irradiate a prism arranged on the substrate with infrared light and measure an intensity of reflected light totally reflected on a surface of the prism on the substrate; and a controller configured perform a control including:

causing the measurer to irradiate the substrate before the substrate processing with infrared light and measure reflected light totally reflected on the surface of the prism on the substrate;

causing the substrate processor to perform the substrate processing on the substrate;

causing the measurer to irradiate the substrate after the substrate processing with infrared light and measure reflected light totally reflected on the surface of the prism on the substrate; and calculating an absorbance spectrum from an intensity spectrum of infrared light for each wave number of the measured reflected light before the substrate processing and an intensity spectrum of infrared light for each wave number of the measured reflected light after the substrate processing.

* * * * *